United States Patent
Shin et al.

(10) Patent No.: US 9,472,258 B2
(45) Date of Patent: Oct. 18, 2016

(54) METHOD OF OPERATING MEMORY DEVICE AND METHOD OF OPERATING MEMORY SYSTEM INCLUDING THE SAME

(71) Applicant: Samsung Electronics Co., Ltd., Suwon-si (KR)

(72) Inventors: Seung-Jun Shin, Incheon (KR); Sung-Min Yim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/970,739

(22) Filed: Dec. 16, 2015

(65) Prior Publication Data

US 2016/0196863 A1    Jul. 7, 2016

(30) Foreign Application Priority Data

Jan. 7, 2015    (KR) ........................ 10-2015-0002010

(51) Int. Cl.
*G11C 11/406* (2006.01)
*G11C 7/02* (2006.01)

(52) U.S. Cl.
CPC ............... *G11C 11/406* (2013.01); *G11C 7/02* (2013.01)

(58) Field of Classification Search
CPC ............................. G11C 7/02; G11C 11/406
See application file for complete search history.

(56) References Cited

U.S. PATENT DOCUMENTS

| | | | |
|---|---|---|---|
| 6,078,543 A | 6/2000 | Kim | |
| 6,944,074 B2 | 9/2005 | Chung et al. | |
| 7,099,209 B2 | 8/2006 | Kang et al. | |
| 7,359,242 B2 | 4/2008 | Kim | |
| 7,663,951 B2 * | 2/2010 | Park | G11C 11/4094 365/189.18 |
| 8,134,879 B2 | 3/2012 | Kim | |
| 9,165,612 B2 * | 10/2015 | Lee | G11C 7/02 |
| 9,361,953 B2 * | 6/2016 | Chi | G11C 7/02 |
| 2014/0006704 A1 | 1/2014 | Greenfield et al. | |
| 2016/0027532 A1 * | 1/2016 | Kim | G11C 29/83 365/200 |
| 2016/0042782 A1 * | 2/2016 | Narui | G11C 11/40611 365/222 |

FOREIGN PATENT DOCUMENTS

| | | | | |
|---|---|---|---|---|
| JP | WO 2014142254 A1 * | 9/2014 | ....... | G11C 11/40611 |
| KR | 2003-0000766 A | 1/2003 | | |

(Continued)

OTHER PUBLICATIONS

Kim et al. "Flipping Bits in Memory Without Accessing Them: An Experimental Study of DRAM Disturbance Errors," 2014 ACM/IEEE 41st International Symposium on Computer Architecture (ISCA), IEEE, Jun. 14-18, 2014. pp. 361-372.*

*Primary Examiner* — Harry W Byrne
*Assistant Examiner* — R Lance Reidlinger
(74) *Attorney, Agent, or Firm* — Muir Patent Law, PLLC

(57) ABSTRACT

A method of operating a memory device comprises receiving a first row address corresponding to a first word line in the first sub bank array and corresponding to a first word line in the second sub bank array, determining whether at least one of the first word lines has been replaced with a spare word line, (a) when neither of the first word lines has been replaced, receiving a first number of row addresses for refresh operations in order to refresh adjacent word lines to the first word lines, and (b) when at least one of the first word lines has been replaced with a spare word line, receiving a second number of row addresses for refresh operations in order to refresh adjacent word lines to any non-replaced first word and any spare word lines, wherein the second number is greater than the first number.

20 Claims, 15 Drawing Sheets

(56) References Cited

FOREIGN PATENT DOCUMENTS

| KR | 2003-0053589 A | 7/2003 |
| KR | 2007-0076045 A | 7/2007 |
| KR | 2008-0029696 A | 4/2008 |
| KR | 2008-0076394 A | 8/2008 |
| KR | 2009-0128607 A | 12/2009 |

* cited by examiner

METHOD OF OPERATING MEMORY DEVICE AND METHOD OF OPERATING MEMORY SYSTEM INCLUDING THE SAME

CROSS-REFERENCE TO RELATED APPLICATION

This application claims priority under 35 USC §119 to Korean Patent Applications No. 10-2015-0002010, filed on Jan. 7, 2015 in the Korean Intellectual Property Office (KIPO), the contents of which are herein incorporated by reference in their entirety.

BACKGROUND

1. Technical Field

The present disclosure relates generally to a memory device and more particularly to a method of operating the memory device and a method of operating a memory system.

2. Description of the Related Art

According to development of electronic devices, the size of memory devices has been downsized. Various research is in progress to downsize the size of the memory devices.

SUMMARY

Some example embodiments provide a method of operating a memory device capable of decreasing a chip size of the memory device by providing adjacent row addresses through same row address lines by a row address circuit.

Some example embodiments provide a method of operating a memory system capable of decreasing the chip size of the memory device by providing the adjacent row addresses through the same row address lines by the row address circuit.

According to example embodiments, a method of operating a memory device including first and second sub bank arrays having corresponding rows of word lines may include receiving a first row address corresponding to a first word line in the first sub bank array and corresponding to a first word line in the second sub bank array, determining whether at least one of the first word lines has been replaced with a spare word line, (a) when neither of the first word lines has been replaced, receiving a first number of row addresses for refresh operations in order to refresh adjacent word lines to the first word lines, and (b) when at least one of the first word lines has been replaced with a spare word line, receiving a second number of row addresses for refresh operations in order to refresh adjacent word lines to any non-replaced first word lines of the first word lines and any spare word lines of the first word lines, wherein the second number is greater than the first number. For either (a) or (b) the number of adjacent word lines being refreshed is the same.

According to example embodiments, a method of operating a memory device including first and second sub bank arrays may include accessing a first word line corresponding to a first row address in each of the first and second sub bank arrays, (a) when neither of the first word lines has been replaced, simultaneously performing a first refresh operation for a second word line adjacent to the first word line in each of the first and second sub bank arrays in response to a second row address, and (b) when at least one of the first word lines of the first and second sub bank arrays has been replaced with a spare word line, performing a second refresh operation for a third word line in the first sub bank array adjacent to a spare word line of the first word line of the first sub bank array in response to a third row address, and performing a third refresh operation for a fourth word line in the second sub bank array adjacent to a non-replaced first word line of the second sub bank array or a spare word line of the first word line of the second sub bank array in response to a fourth row address.

According to example embodiments, a method of operating a memory device including first and second memory cell arrays having first and second respective sets of corresponding word lines may include determining whether a first word line of the first set of word lines corresponding to a first word line of the second set of word lines has been replaced with a spare word line, determining whether the first word line of the second set of word lines has been replaced with a spare word line, (a) when neither of the first word lines has been replaced, performing a first number of refresh operations in order to refresh adjacent word lines to the first word lines, and (b) when at least one of the first word lines has been replaced with a spare word line, performing a second number of refresh operations in order to refresh adjacent word lines to any non-replaced first word lines of the first word lines and any spare word lines of the first word lines, wherein the second number is greater than the first number. For either (a) or (b) the number of adjacent word lines being refreshed is the same.

BRIEF DESCRIPTION OF THE DRAWINGS

Illustrative, non-limiting example embodiments will be more clearly understood from the following detailed description taken in conjunction with the accompanying drawings.

FIG. 3 is a diagram for describing an operation example of the memory device of

FIG. 2 according to certain embodiments.

DETAILED DESCRIPTION

Figure 1:
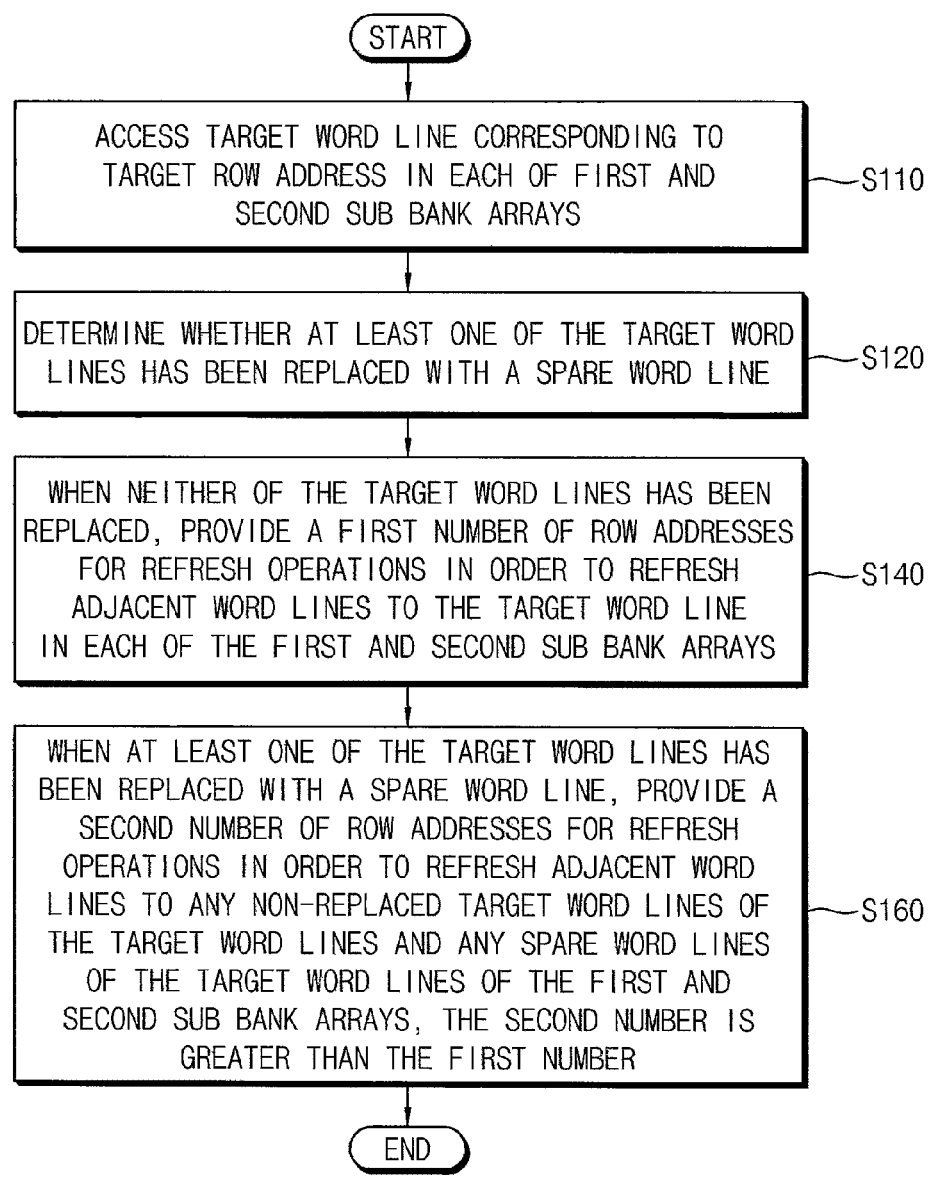
FIG. 1 is a flow chart illustrating a method of operating a memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present inventive concept. Claims may use the terms "first," "second," etc., to describe elements in the claims whether or not those elements are described using these terms in the specification. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
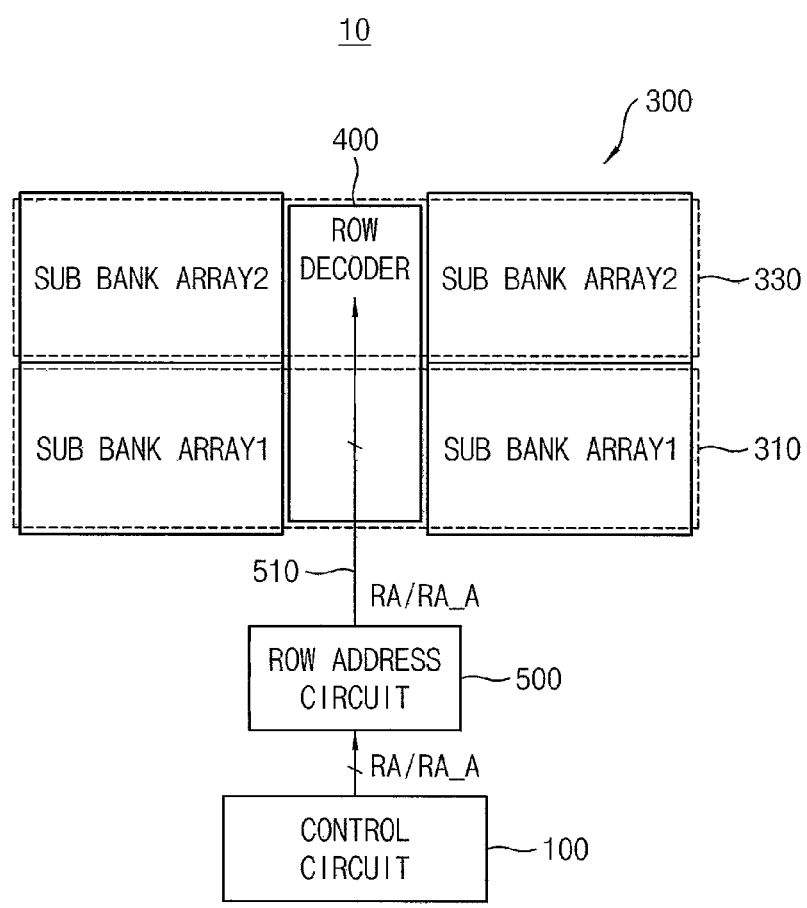
FIG. 2 is a block diagram illustrating a memory device according to example embodiments.
Figure 3:
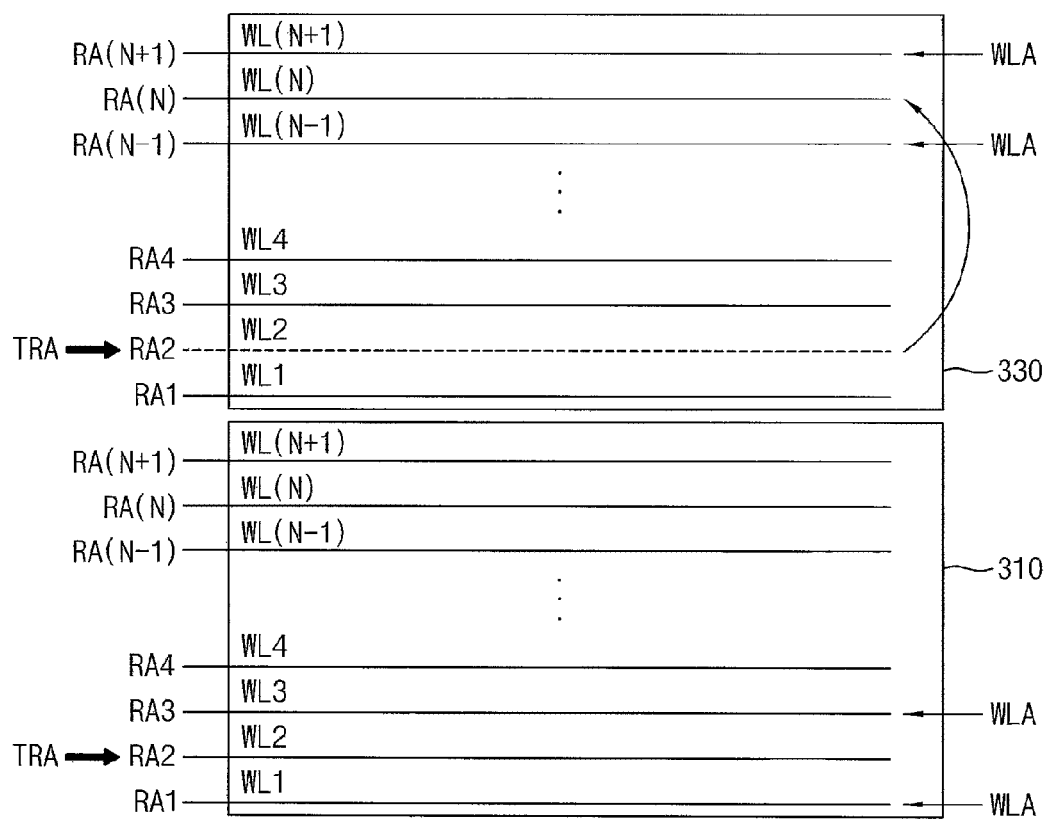

FIG. 1 is a flow chart illustrating a method of operating a memory device according to example embodiments, FIG. 2 is a block diagram illustrating a memory device according to example embodiments and FIG. 3 is a diagram for describing an operation example of the memory device of FIG. 2 according to certain embodiments.

Referring to FIGS. 1 to 3, a memory device 10 may include a controller, also described as a control circuit 100, a merged bank array 300, a row address circuit 500 and a row decoder 400. The merged bank array 300 may include a first sub bank array 310 and a second sub bank array 330. As will be described in FIG. 5, the first sub bank array 310 and the second sub bank array 330 of FIG. 2 may be included in a first bank memory array 280a of FIG. 5. The control circuit 100 and the row address circuit 500 of FIG. 2 may be included in a control logic 210 and/or an address register 220 of FIG. 5. In a method of operating a memory device 10, a target word line in each of the first and second sub bank arrays 310 and 330 corresponding to a target row address may be accessed by a control circuit 100 (S100). When a number of accesses to the target word line corresponding to the target row address is greater than a reference number of times (e.g., 1000, 2000, etc.) in a predetermined period of time, memory cells connected to the adjacent word lines to the target word line may be damaged. Thus, to prevent such damage the memory cells connected to the adjacent word lines may be restored by a refresh operation.

In certain embodiments, the control circuit 100 determines whether at least one of the target word lines has been replaced with a spare word line (S120). For example, the target row address TRA may be a second row address RA2 corresponding to a second word line WL2. The second word line WL2 included in the first sub bank array 310 may be a normal word line (e.g., a properly operating word line). The second word line WL2 included in the second sub bank array 330 may be a word line including one or more bad cells. For example, when the target row address TRA corresponding to the second word line WL2 is transferred from the control circuit 100, an N-th word line WL(N) included in the second sub bank array 330 may be enabled instead of the second word line WL2 included in the second sub bank array 330. Therefore, the control circuit 100 may determine that the target word line corresponding to the target row address TRA has been replaced with a spare word line. The N-th word line WL(N) included in the second sub bank array 330 may be the spare word line.

When neither of the target word lines in the two sub bank arrays 310 and 330 has been replaced, the control circuit 100 may provide a first number of row addresses for refresh operations in order to refresh adjacent word lines to the target word line of each of the first sub bank array 310 and the second sub bank array 330 included in a merged bank array 300 (S140). For example, when the control circuit 100 determines that neither of the target word lines corresponding to the target row address TRA has been replaced, the target word line of each of the first and second sub bank arrays 310 and 330 may be the second word line WL2 of each of the first and second sub bank arrays 310 and 330. The adjacent word lines WLA to the second word line WL2 of each of the first and second sub bank arrays 310 and 330 may be a first word line WL1 of each of the first and second sub bank arrays 310 and 330 and a third word line WL3 of each of the first and second sub bank arrays 310 and 330. The adjacent row address RA_A of each of the first and second sub bank arrays 310 and 330 corresponding to the adjacent word line WLA may be a first row address RA1 of each of the first and second sub bank arrays 310 and 330 and a third row address RA3 of each of the first and second sub bank arrays 310 and 330. Thus, the control circuit 100 may provide row addresses, for example, the first and third row addresses RA1 and RA3 for refresh operations in order to refresh adjacent row word lines to the target word line. Since each row address RA1 or RA3 is the same address for each sub bank array 310 and 330, only two row addresses need to be supplied.

However, when at least one of the target word lines has been replaced with a spare word line, the control circuit 100 may provide a second number of row addresses for refresh operations in order to refresh adjacent word lines to any non-replaced target word lines of the target word lines and any spare word lines of the target word lines of the first sub bank array 310 and the second sub bank array 330 included in a merged bank array 300 (S160). For example, when the control circuit 100 determines that the target word line (e.g., WL2) of the second sub bank array 330 has been replaced with the N-th word line WL(N) of the second sub bank array 330.

The adjacent word lines WLA to the target word line of the first sub bank array 310 may be the first word line WL1 of the first sub bank array 310 and the third word line WL3 of the first sub bank array 310, and the adjacent row addresses RA_A corresponding to the first word line WL1 of the first sub bank array 310 may be the first row address RA1 and corresponding to the third word line WL3 of the first sub bank array 310 may be the third row address RA3. The adjacent word line WLA to the N-th word line WL(N) of the second sub bank array 330 may be an (N−1)th word line WL(N−1) of the second sub bank array 330 and an (N+1)th word line WL(N+1) of the second sub bank array 330. The adjacent row address RA_A corresponding to the adjacent word line WLA of the second sub bank array 330 may be an (N−1)th row address RA(N−1) of the second sub bank array 330 and an (N+1)th row address RA(N+1) of the second sub bank array 330. Thus, the control circuit 100 may provide row addresses, for example, the first, third, (N−1)th, and (N+1)th row addresses RA1, RA3, RA(N−1), and RA(N+1) (e.g., four row addresses) for refresh operations in order to refresh adjacent row word lines to the target word line (e.g., WL2) and the spared word line (e.g., WL(N)).

In example embodiments, a target row address TRA may be a first row address RA1 corresponding to a first word line WL1. For example, the first word line WL1 may be frequently accessed. The first word line WL1 included in the first sub bank array 310 may be a normal word line. The first word line WL1 included in the second sub bank array 330 may be a word line including one or more bad cells. For example, when the target row address TRA corresponding to the first word line WL1 is transferred from the control circuit 100, an (N+1)th word line WL(N+1) included in the second sub bank array 330 may be enabled instead of the first word line WL1 included in the second sub bank array 330. For example, the control circuit 100 may determine that the first word line WL1 of the second sub bank array 330 has been replaced with a spare word line (e.g., the (N30 1)th word line WL(N+1)).

In this example, when neither of the target word lines (e.g., WL1) has been replaced, the control circuit 100 may provide a third number of row addresses for refresh operations in order to refresh adjacent row word lines to the target word line of each of the first and second sub bank arrays 310 and 330 included in a merged bank array 300. For example, when the control circuit 100 determines that neither of the target word lines (e.g., WL1) corresponding to the target row address TRA has been replaced, the target word line of each of the first and second sub bank arrays 310 and 330 may be the first word line WL1 of each of the first and second sub bank arrays 310 and 330. The adjacent word line WLA to the first word line WL1 of the first and second sub bank arrays 310 and 330 may be a second word line WL2 of each of the first and second sub bank arrays 310 and 330. The adjacent row address RA_A of each of the first and second sub bank arrays 310 and 330 corresponding to the adjacent word line WLA may be a second row address RA2 of the first and second sub bank arrays 310 and 330. Thus, the control circuit 100 may provide only a single row address, for example, the first row address RA1 for a refresh operation in order to refresh adjacent row word lines to the target word line.

In addition, when at least one of the target word lines has been replaced with a spare word line, the control circuit 100 may provide a fourth number of row addresses for refresh operations in order to refresh adjacent row word lines to any non-replaced target word lines of the target word lines and any spare word lines of the target word lines of the first sub bank array 310 and the second sub bank array 330 included in a merged bank array 300. For example, when the control circuit 100 determines that the target word line (e.g., WL1) of the second sub bank array 330 has been replaced with the (N+1)th word line WL(N+1) of the second sub bank array 330. The adjacent word lines WLA to the target word line of the first sub bank array 310 may be the second word line WL2 of the first sub bank array 310. The adjacent row addresses RA_A corresponding to the first word line WL1 of the first sub bank array 310 may be the first row address RA1. The adjacent word line WLA to the (N+1)th word line WL(N+1) of the second sub bank array 330 may be an N-th word line WL(N) of the second sub bank array 330. The adjacent row addresses RA_A corresponding to the (N+1)th word line WL(N+1) of the second sub bank array 330 may be the nth row address RA(N). Thus, the control circuit 100 may provide row addresses, for example, the second and nth row addresses RA2 and RA(N) for refresh operations in order to refresh adjacent row word lines to the target word line (e.g., WL1) and the spared word line (e.g., WL(N+1). As such, for frequently accessed target word lines, when at least one normal target word line has been replaced with a spare word line, a different number of addresses may be used to refresh adjacent rows compared to no normal target word lines have been replaced.

A row address circuit 500 transfers the adjacent row addresses RA_A to a row decoder 400 through the same row address lines 510. For example, when the target word line corresponding to the target row address TRA is frequently enabled (e.g., greater than a particular threshold, such as 1000, 2000, etc.) in a predetermined period of time, the data stored in memory cells that are connected to the adjacent word line WLA to the target word line corresponding to the target row address TRA may be damaged. Therefore, to avoid damage, the data stored in memory cells that are connected to the adjacent word lines WLA to the target word line corresponding to the target row address TRA may be restored. The operation of restoring the stored data in memory cells may be a refresh operations described above.

When at least one of the target word lines in the first and second sub bank arrays 310 and 330 has been replaced, one or more adjacent row addresses RA_A of the first sub bank array 310 corresponding to one or more adjacent word lines WLA to the target word line of the first sub bank array 310 may be different from one or more adjacent row addresses RA_A of the second sub bank array 330 corresponding to one or more adjacent word lines WLA to the target word line of the second sub bank array 330. For example, the one or more adjacent row addresses RA_A of the first sub bank array 310 may be a first row address RA1 of the first sub bank array 310 and a third row address RA3 of the first sub bank array 310. The one or more adjacent row addresses RA_A of the second sub bank array 330 may be an (N−1)th row address RA(N−1) of the second sub bank array 330 and an (N+1)th row address RA(N+1) of the second sub bank array 330. For example, when the target word line corresponding to the target row address TRA has been replaced in the second sub bank array 330, the row address circuit 500 may provide the first row address RA1 through the row address lines 510 to restore the data of the memory cells that are connected to first word line WL1 corresponding to the first row address RA1 of the first sub bank array 310. When the row address circuit 500 provides the first row address RA1, the data of the memory cells that are connected to an (N−1)th word line WL(N−1) corresponding to the (N−1)th row address RA(N−1) of the second sub bank array 330 may not be restored. In addition, the row address circuit 500 may provide the third row address RA3 through the row address lines 510 to restore the data of the memory cells that are connected to a third word line WL3 corresponding to the third row address RA3 of the first sub bank array 310. When the row address circuit 500 provides the third row address RA3, the data of the memory cells that are connected to an (N+1)th word line WL(N+1) corresponding to the (N+1)th row address RA(N+1) of the second sub bank array 330 may not be restored.

In example embodiments, the row address circuit 500 may separately provide the (N−1)th row address RA(N−1) through the same row address lines 510 to restore the data of the memory cells that are connected to (N−1)th word line WL(N−1) corresponding to the (N−1)th row address RA(N−1) of the second sub bank array 330. In addition, the row address circuit 500 may separately provide the (N+1)th row address RA(N+1) through the same row address lines 510 to restore the data of the memory cells that are connected to (N+1)th word line WL(N+1) corresponding to the (N+1)th row address RA(N+1) of the second sub bank array 330. If this method of operating the memory device 10 is used, an additional circuit may not be required to restore the data of the memory cells that are connected to the (N−1)th word line WL(N−1) corresponding to the (N−1)th row address RA(N−1) of the second sub bank array 330 and the (N+1)th word line WL(N+1) corresponding to the (N+1)th row address RA(N+1) of the second sub bank array 330.

The above method of operating the memory device 10 may decrease the chip size of the memory device 10 by providing the adjacent row addresses RA_A through the same row address lines 510 by the row address circuit 500.

In example embodiments, when the target word line corresponding to the target row address TRA has been replaced in the second sub bank array 330, the row address circuit 500 may provide the first row address RA1 and the third row address RA3 for refresh operations on the first and third word lines WL1 and WL3. When the row address circuit 500 provides the first row address RA1, the first word line WL1 adjacent to the target word line (e.g., WL2) in each of the first and second sub bank arrays 310 and 330 may be simultaneously selected. Also, when the row address circuit 500 provides the third row address RA3, the third word line WL3 adjacent to the target word line (e.g., WL2) in each of the first and second sub bank arrays 310 and 330 may be simultaneously selected.

In example embodiments, when the target word line corresponding to the target row address TRA has been replaced in the second sub bank array 330, the row address circuit 500 may provide the (N−1)th row address RA(N−1) and the (N+1)th row address RA(N+1) based on a refresh command. When the row address circuit 500 provides the (N−1)th row address RA(N−1), the word line WL(N−1) adjacent to the target word line in each of the first and second sub bank arrays may be selected simultaneously. Also, when the row address circuit 500 provides the (N+1)th row address RA(N+1), the word line WL(N+1) adjacent to the target word line in each of the first and second sub bank arrays may be selected simultaneously.

Figure 4:
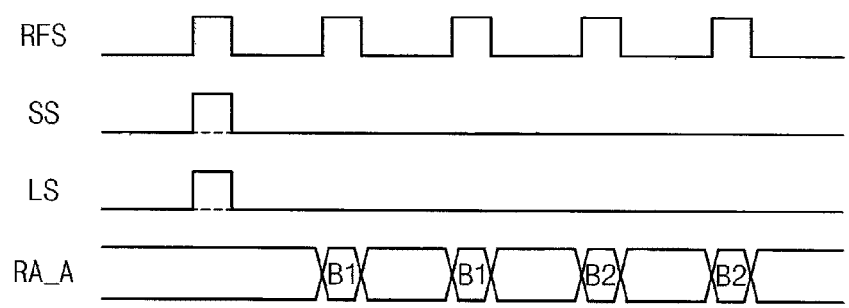
FIG. 4 is a timing diagram for describing an operation example of the memory device of FIG. 2 according to certain embodiments.

FIG. 4 is a timing diagram for describing an operation example of the memory device of FIG. 2 according to certain embodiments.

Referring to FIGS. 3 and 4, when the target word line corresponding to the target row address TRA has been replaced in the second sub bank array 330, the adjacent row address RA_A of the first sub bank array 310 and the adjacent row address RA_A of the second sub bank array 330 may be transferred through the same row address lines 510 based on a refresh signal RFS. Hereinafter, the refresh signal RFS may be referred as a refresh command and may be received from a memory controller (not shown).

In example embodiments, after the adjacent row address RA_A of the first sub bank array 310 is transferred through the same row address lines 510 based on the refresh signal RFS, the adjacent row address RA_A of the second sub bank array 330 may be transferred through the same row address lines 510 based on the refresh signal RFS. For example, when the control circuit 100 determines that the target word line WL2 corresponding to the target row address TRA in the second sub bank array 330 has been replaced, a repair determination signal may be a first logic level. The first logic level may be a logic high level and the second logic level may be a logic low level. The repair determination signal may include a short signal SS and a long signal LS. After the repair determination signal transitions from the first logic level to the second logic level, if the refresh signal RFS is the logic high level, the row address circuit 500 may provide the adjacent row address RA_A that is the first row address RA1 of the first sub bank array 310 through the same row address lines 510. When the row address circuit 500 provides the adjacent row address RA_A that is the first row address RA1 of the first sub bank array 310, the first word line WL1 of the first sub bank array 310 corresponding to the adjacent row address RA_A that is the first row address RA1 of the first sub bank array 310 may be enabled. When the first word line WL1 of the first sub bank array 310 corresponding to the adjacent row address RA_A that is the first row address RA1 of the first sub bank array 310 is enabled, the stored data in the memory cells that are connected to the first word line WL1 of the first sub bank array 310 may be restored.

When the refresh signal RFS is the logic high level again, the row address circuit 500 may provide the adjacent row address RA_A that is the third row address RA3 of the first sub bank array 310 through the same row address lines 510. When the row address circuit 500 provides the adjacent row address RA_A that is the third row address RA3 of the first sub bank array 310, the third word line WL3 of the first sub bank array 310 corresponding to the adjacent row address RA_A that is the third row address RA3 of the first sub bank array 310 may be enabled. When the third word line WL3 of the first sub bank array 310 corresponding to the adjacent row address RA_A that is the third row address RA3 of the first sub bank array 310 is enabled, the stored data in the memory cells that are connected to the third word line WL3 of the first sub bank array 310 may be restored.

When the refresh signal RFS is the logic high level again, the row address circuit 500 may provide the adjacent row address RA_A that is the (N−1)th row address RA(N−1) of the second sub bank array 330 through the same row address lines 510. When the row address circuit 500 provides the adjacent row address RA_A that is the (N−1)th row address RA(N−1) of the second sub bank array 330, the (N−1)th word line WL(N−1) of the second sub bank array 330 corresponding to the adjacent row address RA_A that is the (N−1)th row address RA(N−1) of the second sub bank array 330 may be enabled. When the (N−1)th word line WL(N−1) of the second sub bank array 330 corresponding to the adjacent row address RA_A that is the (N−1)th row address RA(N−1) of the second sub bank array 330 is enabled, the stored data in the memory cells that are connected to the (N−1)th word line WL(N−1) of the second sub bank array 330 may be restored.

When the refresh signal RFS is the logic high level again, the row address circuit 500 may provide the adjacent row address RA_A that is the (N+1)th row address RA(N+1) of the second sub bank array 330 through the same row address lines 510. In case the row address circuit 500 provides the adjacent row address RA_A that is the (N+1)th row address RA(N+1) of the second sub bank array 330, the (N+1)th word line WL(N+1) of the second sub bank array 330 corresponding to the adjacent row address RA_A that is the (N+1)th row address RA(N+1) of the second sub bank array 330 may be enabled. In case the (N+1)th word line WL(N+1) of the second sub bank array 330 corresponding to the adjacent row address RA_A that is the (N+1)th row address RA(N+1) of the second sub bank array 330 is enabled, the stored data in the memory cells that are connected to the (N+1)th word line WL(N+1) of the second sub bank array 330 may be restored.

In example embodiments, the operation of restoring the stored data in memory cells may be referred to as a refresh operation. Each particular instance of restoring a word line or restoring two or more word lines using the same row address may also be referred to as a refresh operation, or more specifically as a refresh sub-operation.

The method of operating the memory device 10 may decrease the chip size of the memory device 10 by providing the adjacent row addresses RA_A through the same row address lines 510 by the row address circuit 500.

In example embodiments, an adjacent row address RA_A of the first sub bank array 310 may correspond to a word line position that is greater than a word line position of a word line corresponding to the target row address TRA of the first sub bank array 310 by one. For example, the word line corresponding to the target row address TRA of the first sub bank array 310 may be the second word line WL2 of the first sub bank array 310. An adjacent row address RA_A of the first sub bank array 310 may be the third row address RA3 of the first sub bank array 310. The word line position of the word line corresponding to the target row address TRA of the first sub bank array 310 may be 2. The word line position of the word line corresponding to the adjacent row address RA_A of the first sub bank array 310 may be 3. For example, the word line position of the word line corresponding to the adjacent row address RA_A of the first sub bank array 310 may be greater than the word line position of the word line corresponding to the target row address TRA of the first sub bank array 310 by one.

In an example embodiment, an adjacent row address RA_A of the second sub bank array 330 may correspond to a word line position that is greater than a word line position of a word line corresponding to the target row address TRA of the second sub bank array 330 by one. For example, the word line corresponding to the target row address TRA of the second sub bank array 330 may be the N-th word line WL(N) of the second sub bank array 330. The adjacent row address RA_A of the first sub bank array 310 may be the (N+1)th row address RA(N+1) of the second sub bank array 330. The word line position of the word line corresponding to the target row address TRA of the second sub bank array 330 may be N. The word line position of the word line corresponding to the adjacent row address RA_A of the second sub bank array 330 may be N+1. For example, the word line position of the word line corresponding to the adjacent row address RA_A of the second sub bank array 330 may be greater than the word line position of the word line corresponding to the target row address TRA of the second sub bank array 330 by one.

In an example embodiment, an adjacent row address RA_A of the first sub bank array 310 and a corresponding adjacent row address RA_A of the second sub bank array 330 may be transferred through the same row address lines 510 based on the refresh signal RFS. The adjacent row address RA_A of the first sub bank array 310 may correspond to the word line position that is greater than the word line position of the word line corresponding to the target row address TRA of the first sub bank array 310 by one. An adjacent row address RA_A of the second sub bank array 330 may correspond to the word line position that is greater than the word line position of the word line corresponding to the target row address TRA of the second sub bank array 330 by one. For example, after the repair determination signal transitions from the first logic level to the second logic level, if the refresh signal RFS is the logic high level, the row address circuit 500 may provide the adjacent row address RA_A that is the third row address RA3 of the first sub bank array 310 through the same row address lines 510. When the row address circuit 500 provides the adjacent row address RA_A that is the third row address RA3 of the first sub bank array 310, the third word line WL3 of the first sub bank array 310 corresponding to the adjacent row address RA_A that is the third row address RA3 of the first sub bank array 310 may be enabled. When the third word line WL3 of the first sub bank array 310 corresponding to the adjacent row address RA_A that is the third row address RA3 of the first sub bank array 310 is enabled, the stored data in the memory cells that are connected to the third word line WL3 of the first sub bank array 310 may be restored. When the refresh signal RFS is the logic high level again, the row address circuit 500 may provide the adjacent row address RA_A that is the (N+1)th row address RA(N+1) of the second sub bank array 330 through the same row address lines 510. When the row address circuit 500 provides the adjacent row address RA_A that is the (N+1)th row address RA(N+1) of the second sub bank array 330, the (N+1)th word line WL(N+1) of the second sub bank array 330 corresponding to the adjacent row address RA_A that is the (N+1)th row address RA(N+1) of the second sub bank array 330 may be enabled. When the (N+1)th word line WL(N+1) of the second sub bank array 330 corresponding to the adjacent row address RA_A that is the (N+1)th row address RA(N+1) of the second sub bank array 330 is enabled, the stored data in the memory cells that are connected to the (N+1)th word line WL(N+1) of the second sub bank array 330 may be restored.

In an example embodiment, an adjacent row address RA_A of the first sub bank array 310 may correspond to a word line position that is less than a word line position of a word line corresponding to the target row address TRA of the first sub bank array 310 by one. For example, the word line corresponding to the target row address TRA of the first sub bank array 310 may be the second word line WL2 of the first sub bank array 310. An adjacent row address RA_A of the first sub bank array 310 may be the first row address RA1 of the first sub bank array 310. The word line position of the word line corresponding to the target row address TRA of the first sub bank array 310 may be 2. The word line position of the word line corresponding to the adjacent row address RA_A of the first sub bank array 310 may be 1. In this case, the word line position of the word line corresponding to the adjacent row address RA_A of the first sub bank array 310 may be less than the word line position of the word line corresponding to the target row address TRA of the first sub bank array 310 by one.

In an example embodiment, an adjacent row address RA_A of the second sub bank array 330 may correspond to a word line position that is less than a word line position of a word line corresponding to the target row address TRA of the second sub bank array 330 by one. For example, the word line corresponding to the target row address TRA of the second sub bank array 330 may be the N-th word line WL(N) of the second sub bank array 330. An adjacent row address RA_A of the first sub bank array 310 may be the (N-1)th row address RA(N-1) of the second sub bank array 330. The word line position of the word line corresponding to the target row address TRA of the second sub bank array 330 may be N. The word line position of the word line corresponding to the adjacent row address RA_A of the second sub bank array 330 may be N-1). For example, the word line position of the word line corresponding to the adjacent row address RA_A of the second sub bank array 330 may be less than the word line position of the word line corresponding to the target row address TRA of the second sub bank array 330 by one.

In an example embodiment, an adjacent row address RA_A of the first sub bank array 310 and the adjacent row address RA_A of the second sub bank array 330 may be transferred through the same row address lines 510 based on the refresh signal RFS. The adjacent row address RA_A of the first sub bank array 310 may correspond to the word line position that is less than the word line position of the word line corresponding to the target row address TRA of the first sub bank array 310 by one. The adjacent row address RA_A of the second sub bank array 330 may correspond to the word line position that is less than the word line position of the word line corresponding to the target row address TRA of the second sub bank array 330 by one. For example, after the repair determination signal transitions from the first logic level to the second logic level, if the refresh signal RFS is the logic high level, the row address circuit 500 may provide the adjacent row address RA_A that is the first row address RA1 of the first sub bank array 310 through the same row address lines 510. In a case where the row address circuit 500 provides the adjacent row address RA_A that is the first row address RA1 of the first sub bank array 310, the first word line WL1 of the first sub bank array 310 corresponding to the adjacent row address RA_A that is the first row address RA1 of the first sub bank array 310 may be enabled. In case the first word line WL1 of the first sub bank array 310 corresponding to the adjacent row address RA_A that is the first row address RA1 of the first sub bank array 310 is enabled, the stored data in the memory cells that are connected to the first word line WL1 of the first sub bank array 310 may be restored. When the refresh signal RFS is the logic high level again, the row address circuit 500 may provide the adjacent row address RA_A that is the (N-1)th row address RA(N-1) of the second sub bank array 330 through the same row address lines 510. In a case where the row address circuit 500 provides the adjacent row address RA_A that is the (N-1)th row address RA(N-1) of the second sub bank array 330, the (N-1)th word line WL(N-1) of the second sub bank array 330 corresponding to the adjacent row address RA_A that is the (N-1)th row address RA(N-1) of the second sub bank array 330 may be enabled. When the (N-1)th word line WL(N-1) of the second sub bank array 330 corresponding to the adjacent row address RA_A that is the (N-1)th row address RA(N-1) of the second sub bank array 330 is enabled, the stored data in the memory cells that are connected to the (N-1)th word line WL(N-1) of the second sub bank array 330 may be restored. The operation of restoring the stored data in memory cells may be the refresh operation.

Figure 5:
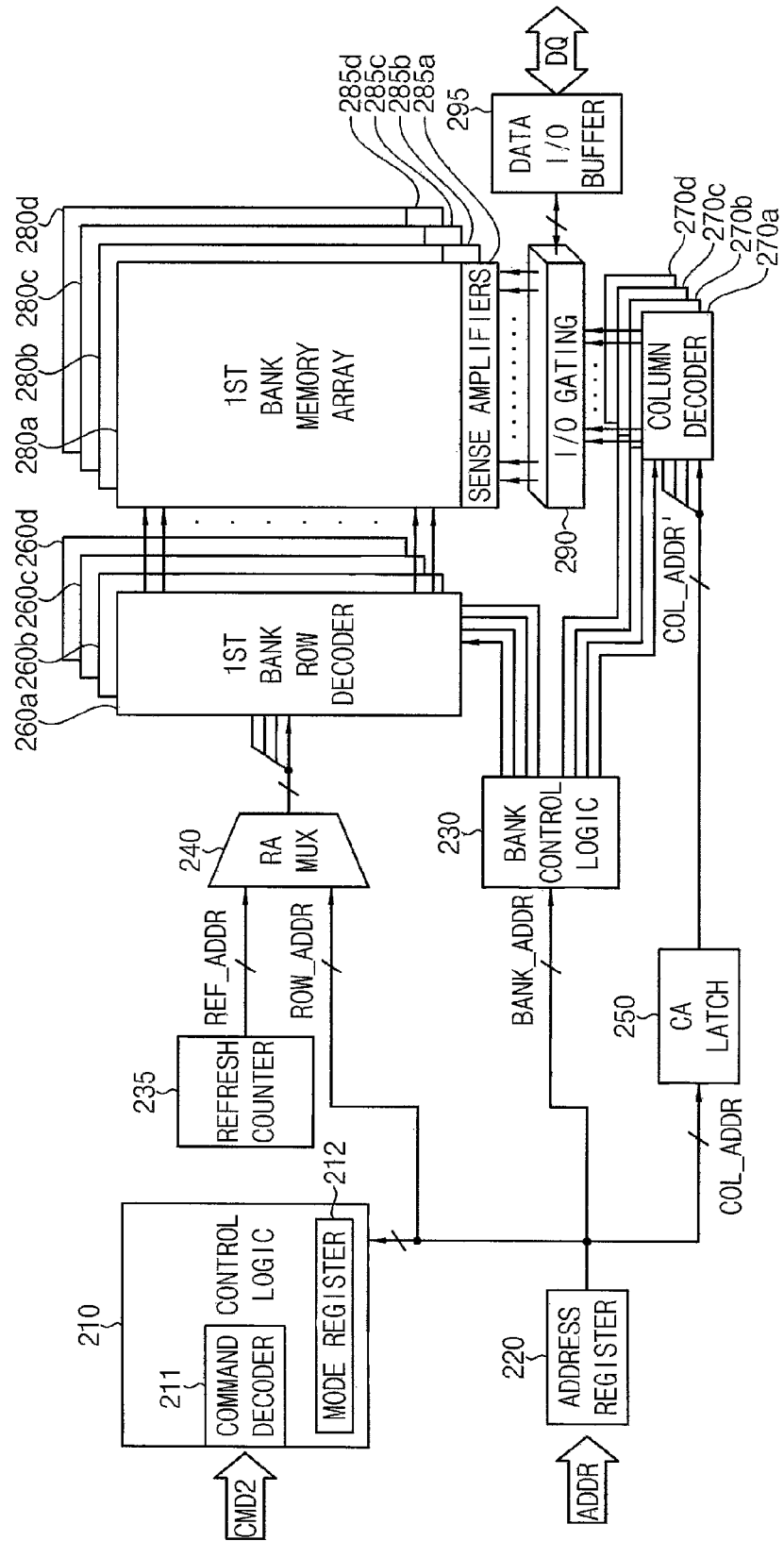
FIG. 5 is a block diagram illustrating an example of the memory device of FIG. 2 according to certain embodiments.

FIG. 5 is a block diagram illustrating an example of the memory device of FIG. 2 according to certain embodiments.

Referring to FIG. 5, a memory device 201 includes a control logic 210, an address register 220, a bank control logic 230, a row address multiplexer 240, a refresh counter 235, a column address latch 250, a row decoder, a column decoder, a memory cell array, a sense amplifier unit, an input/output gating circuit 290 and a data input/output buffer 295. In some embodiments, the memory device 201 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The memory cell array may include first through fourth bank memory arrays 280a, 280b, 280c and 280d. For example, the first sub bank array 310 and the second sub bank array 330 of FIG. 2 may be included in the first bank memory array 280a of FIG. 5. The control circuit 100 and the row address circuit 500 of FIG. 2 may be included in the control logic 210 and/or the address register 220 of FIG. 5. The row decoder may include first through fourth bank row decoders 260a, 260b, 260c and 260d respectively coupled to the first through fourth bank memory arrays 280a, 280b, 280c and 280d, the column decoder may include first through fourth bank column decoders 270a, 270b, 270c and 270d respectively coupled to the first through fourth bank memory arrays 280a, 280b, 280c and 280d, and the sense amplifier unit may include first through fourth bank sense amplifiers 285a, 285b, 285c and 285d respectively coupled to the first through fourth bank memory arrays 280a, 280b, 280c and 280d. The first through fourth bank memory arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the volatile memory device 201 is illustrated as including four banks, the volatile memory device 201 may include any number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR' output from the column address latch 250, and may control the input/output gating circuit 290 to output data corresponding to the column address COL_ADDR'.

The input/output gating circuit 290 may include circuitry for gating input/output data. The input/output gating circuit 290 may further include an input data mask logic, read data latches for storing data output from the first through fourth bank memory arrays 280a, 280b, 280c and 280d, and write drivers for writing data to the first through fourth bank memory arrays 280a, 280b, 280c and 280d.

Data DQ to be read from one bank array of the first through fourth bank memory arrays 280a, 280b, 280c and 280d may be sensed by a sense amplifier coupled to the one bank memory array, and may be stored in the read data latches. The data DQ stored in the read data latches may be provided to the memory controller via the data input/output buffer 295. Data DQ to be written to one bank array of the first through fourth bank memory arrays 280a, 280b, 280c and 280d may be provide from the memory controller to the data input/output buffer 295. The data DQ provided to the data input/output buffer 295 may be written to the one array bank via the write drivers.

The control logic 210 may control operations of the memory device 201. For example, the control logic 210 may generate control signals for the memory device 201 to perform a write operation or a read operation. The control logic 210 may include a command decoder 211 that decodes a command CMD received from the memory controller and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may further receive a clock signal (CLK) and a clock enable signal (/CKE) for operating the memory device 201 in a synchronous manner.

Figure 6:
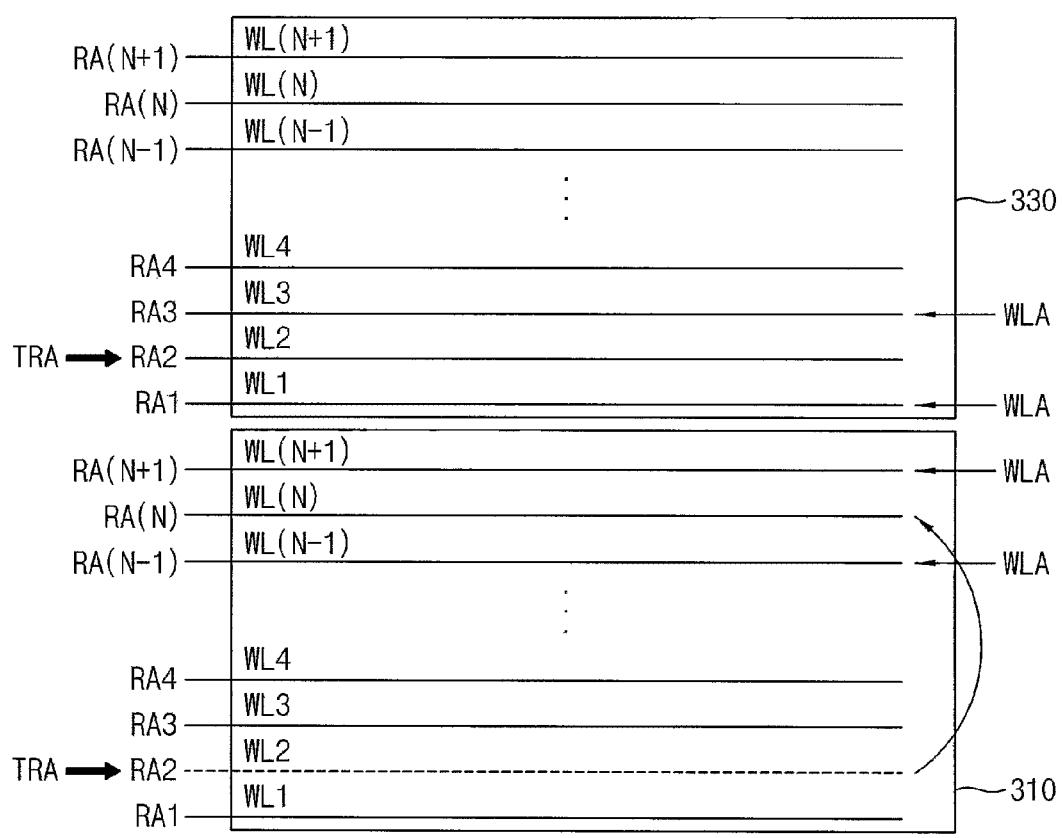
FIG. 6 is a diagram for describing another operation example of the memory device of FIG. 2 according to certain embodiments.

FIG. 6 is a diagram for describing another operation example of the memory device of FIG. 2 according to certain embodiments.

Referring to FIGS. 1, 2 and 6, a memory device 10 may include a control circuit 100, a merged bank array 300, a row address circuit 500 and a row decoder 400. The merged bank array 300 may include a first sub bank array 310 and a second sub bank array 330. In a method of operating a memory device 10, the control circuit 100 determines whether a target word line corresponding to a target row address TRA has been replaced or not. For example, the target row address TRA may be a row address corresponding to a second word line WL2. The second word line WL2 included in the second sub bank array 330 may be a normal word line. The second word line WL2 included in the first sub bank array 310 may be a word line including one or more bad cells. For example, when the target row address TRA corresponding to the second word line WL2 included in the first sub bank array 310 is transferred from the control circuit 100, an N-th word line WL(N) included in the second sub bank array 330 may be enabled instead of the second word line WL2 included in the first sub bank array 310. For example, the control circuit 100 may determine that the target word line of the first sub bank array 310 corresponding to the target row address TRA has been replaced.

The control circuit 100 provides adjacent row addresses RA_A of adjacent word lines WLA to the target word line corresponding to the target row address TRA of the first sub bank array 310 and the second sub bank array 330 included in a merged bank array 300 based on whether the target word line has been replaced or not. For example, when the control circuit 100 determines that the target word line of the second sub bank array 330 is the normal word line WL2, the adjacent word lines WLA to the second word line WL2 of the second sub bank array 330 may be a first word line WL1 of the second sub bank array 330 and a third word line WL3 of the second sub bank array 330. The adjacent row addresses RA_A of the second sub bank array 330 may be a first row address RA1 of the second sub bank array 330 and a third row address RA3 of the second sub bank array 330. In addition, when the control circuit 100 determines that the target word line of the first sub bank array 310 has been replaced, the target word line of the first sub bank array 310 may be the N-th word line WL(N) of the first sub bank array 310. The adjacent word lines WLA to the N-th word line WL(N) of the first sub bank array 310 may be an (N−1)th word line WL(N−1) of the first sub bank array 310 and an (N+1)th word line WL(N+1) of the first sub bank array 310. The adjacent row addresses RA_A of the first sub bank array 310 may be an (N−1)th row address RA(N−1) of the first sub bank array 310 and an (N+1)th row address RA(N+1) of the first sub bank array 310.

The row address circuit 500 transfers the adjacent row addresses RA_A to a row decoder 400 through the same row address lines 510. For example, when the target word line corresponding to the target row address TRA is enabled, the data stored in memory cells that are connected to the adjacent word line WLA to the target word line may be damaged. Therefore, the data stored in memory cells that are connected to the adjacent word line WLA to the target word line may need to be restored. The operation of restoring the stored data in memory cells may be the refresh operations described above.

When the target word line corresponding to the target row address TRA has been replaced, the adjacent row address RA_A of the first sub bank array 310 may be different from the adjacent row address RA_A of the second sub bank array 330. For example, the adjacent row addresses RA_A of the second sub bank array 330 may be a first row address RA1 of the second sub bank array 330 and a third row address RA3 of the second sub bank array 330. The adjacent row addresses RA_A of the first sub bank array 310 may be the (N−1)th row address RA(N−1) of the first sub bank array 310 and the (N+1)th row address RA(N+1) of the first sub bank array 310. For example, the row address circuit 500 may provide the first row address RA1 through the row address lines 510 to restore the data of the memory cells that are connected to a first word line WL1 corresponding to the first row address RA1 of the first sub bank array 310. For example, the data of the memory cells that are connected to the (N−1)th word line WL(N−1) corresponding to the (N−1)th row address RA(N−1) of the second sub bank array 330 may not be restored. In addition, the row address circuit 500 may provide the third row address RA3 through the row address lines 510 to restore the data of the memory cells that are connected to third word line WL3 corresponding to the third row address RA3 of the second sub bank array 330. For example, the data of the memory cells that are connected to the (N+1)th word line WL(N+1) corresponding to the (N+1)th row address RA(N+1) of the second sub bank array 330 may not be restored. In addition, the row address circuit 500 may separately provide the (N−1)th row address RA(N−1) through the same row address lines 510 to restore the data of the memory cells that are connected to the (N−1)th word line WL(N−1) corresponding to the (N−1)th row address RA(N−1) of the first sub bank array 310. In addition, the row address circuit 500 may separately provide the (N+1)th row address RA(N+1) through the same row address lines 510 to restore the data of the memory cells that are connected to the (N+1)th word line WL(N+1) corresponding to the (N+1)th row address RA(N+1) of the first sub bank array 310. If the method of operating the memory device 10 is used, the additional circuit may not be required to restore the data of the memory cells that are connected to the (N−1)th word line WL(N−1) corresponding to the (N−1)th row address RA(N−1) of the first sub bank array 310 and the (N+1)th word line WL(N+1) corresponding to the (N+1)th row address RA(N+1) of the first sub bank array 310.

The method of operating the memory device 10 may decrease the chip size of the memory device 10 by providing the adjacent row addresses RA_A through the same row address lines 510 by the row address circuit 500.

Figure 7:
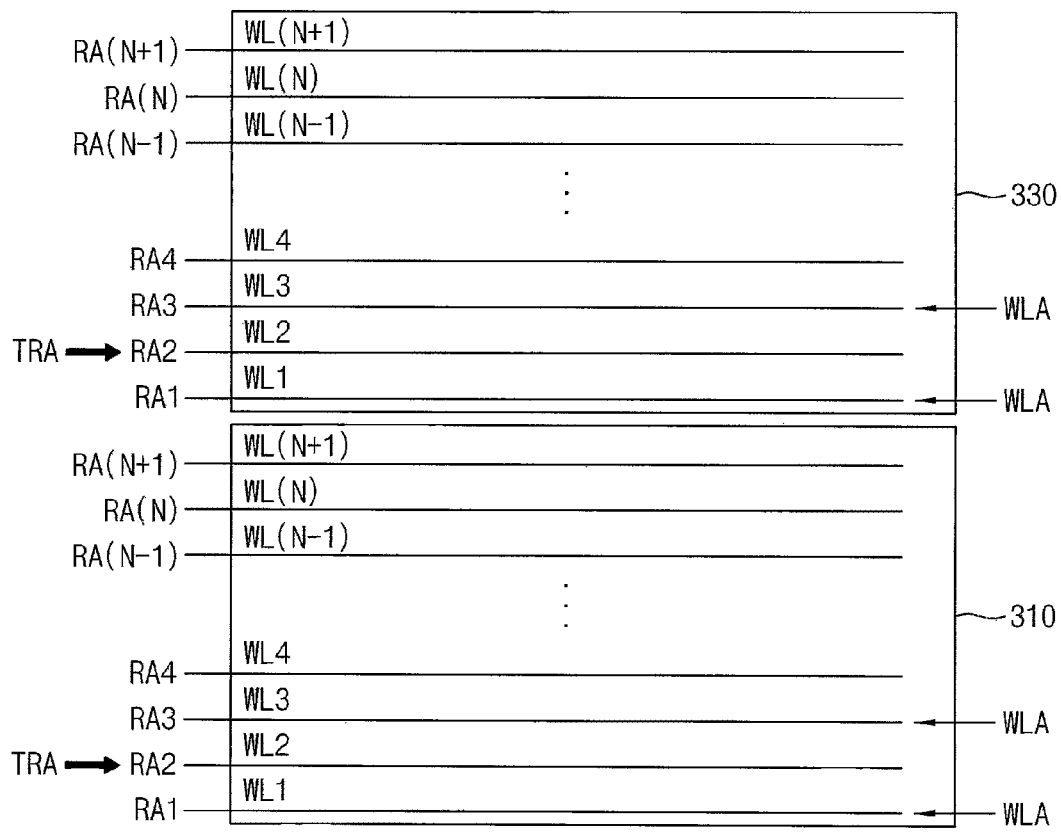
FIG. 7 is a diagram for describing still another operation example of the memory device of FIG. 2 according to certain embodiments.
Figure 8:
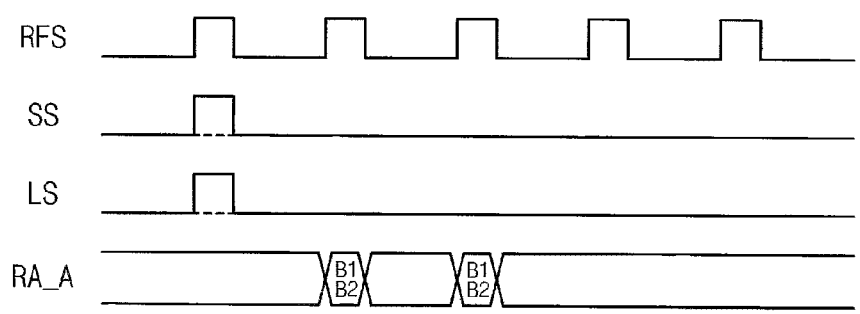
FIG. 8 is a timing diagram for describing still another operation example of the memory device of FIG. 2 according to certain embodiments.

FIG. 7 is a diagram for describing still another operation example of the memory device of FIG. 2 according to certain embodiments and FIG. 8 is a timing diagram for describing still another operation example of the memory device of FIG. 2 according to certain embodiments.

Referring to FIGS. 7 and 8, when the target word line corresponding to the target row address TRA has not been replaced, the adjacent word lines to the target word line corresponding to the adjacent row address RA_A of the first sub bank array 310 may be equal to the adjacent row address RA_A of the second sub bank array 330. For example, when the target word line has not been replaced, the adjacent word lines to the target word line corresponding to the adjacent row address RA_A of the first sub bank array 310 may be the first word line WL1 corresponding to the first row address RA1 of the first sub bank array 310 and the third word line WL3 corresponding to the third row address RA3 of the first sub bank array 310. The adjacent word lines to the target word line corresponding to the adjacent row address RA_A of the second sub bank array 330 may be the first word line WL1 corresponding to the first row address RA1 of the second sub bank array 330 and the third word line WL3 corresponding to the third row address RA3 of the second sub bank array 330. For example, the row address circuit 500 may provide the first row address RA1 through the row address lines 510 to restore the data of the memory cells that are connected to the first word line WL1 in each of the first and second sub bank arrays 310 and 330 corresponding to the first row address RA1. For example, the data of the memory cells that are connected to first word line WL1 corresponding to the first row address RA1 of the second sub bank array 330 may be restored when the first word line WL1 in the first sub bank array 310 is selected. In addition, the row address circuit 500 may provide the third row address RA3 through the row address lines 510 to restore the data of the memory cells that are connected to third word line WL3 in each of the first and second sub bank arrays 310 and 330 corresponding to the third row address RA3. For example, the data of the memory cells that are connected to third word line WL3 corresponding to the third row address RA3 of the second sub bank array 330 may be restored when the third word line WL3 in the first sub bank array 310 is selected.

In example embodiments, an adjacent row address RA_A of the first sub bank array 310 may correspond to a word line position that is greater or less than a word line position of a word line corresponding to the target row address TRA of the first sub bank array 310 by one. An adjacent row address RA_A of the second sub bank array 330 may correspond to a word line position that is greater or less than a word line position of a word line corresponding to the target row address TRA of the second sub bank array 330 by one. For example, the word line corresponding to the target row address TRA of the first sub bank array 310 may be the second word line WL2 of the first sub bank array 310. The adjacent word lines corresponding to the adjacent row address RA_A of the first sub bank array 310 may be the first and third word lines WL1 and WL3 corresponding to the first row address RA1 and the third row address RA3 of the first sub bank array 310, respectively. The word line position of the word line corresponding to the target row address TRA of the first sub bank array 310 may be 2. The word line position of the word line corresponding to the adjacent row address RA_A of the first sub bank array 310 may be 1 and 3. For example, the word line position of the word line corresponding to the adjacent row address RA_A of the first sub bank array 310 may be less or greater than the word line position of the word line corresponding to the target row address TRA of the first sub bank array 310 by one. In addition, the word line corresponding to the target row address TRA of the second sub bank array 330 may be the second word line WL2 of the second sub bank array 330. The adjacent word line corresponding to the adjacent row address RA_A of the second sub bank array 330 may be the first row address RA1 and the third row address RA3 of the second sub bank array 330. The word line position of the word line corresponding to the target row address TRA of the second sub bank array 330 may be 2. The word line position of the word line corresponding to the adjacent row address RA_A of the second sub bank array 330 may be 1 and 3. For example, the word line position of the word line corresponding to the adjacent row address RA_A of the second sub bank array 330 may be less or greater than the word line position of the word line corresponding to the target row address TRA of the second sub bank array 330 by one.

In example embodiments, after the adjacent row address RA_A that is greater than the word line position of the word line corresponding to the target row address TRA by one is transferred through the same row address lines 510 based on the refresh signal RFS, the adjacent row address RA_A that is less than the word line position of the word line corresponding to the target row address TRA by one may be transferred through the same row address lines 510 based on the refresh signal RFS. For example, after the repair determination signal transitions from the first logic level to the second logic level, if the refresh signal RFS is the logic high level, the row address circuit 500 may provide the adjacent row address RA_A that is the third row address RA3 through the same row address lines 510 When the row address circuit 500 provides the adjacent row address RA_A that is the third row address RA3, the third word line WL3 of the first sub bank array 310 and the third word line WL3 of the second sub bank array 330 corresponding to the adjacent row address RA_A that is the third row address RA3 may be simultaneously enabled. When the third word line WL3 of the first sub bank array 310 and the third word line WL3 of the second sub bank array 330 corresponding to the adjacent row address RA_A that is the third row address RA3 is simultaneously enabled, the stored data in the memory cells that are connected to the third word line WL3 of the first sub bank array 310 and the third word line WL3 of the second sub bank array 330 may be restored.

If the refresh signal RFS is the logic high level again, the row address circuit 500 may provide the adjacent row address RA_A that is the first row address RA1 through the same row address lines 510. When the row address circuit 500 provides the adjacent row address RA_A that is the first row address RA1, the first word line WL1 of the first sub bank array 310 and the first word line WL1 of the second sub bank array 330 corresponding to the adjacent row address RA_A that is the first row address RA1 may be simultaneously enabled. When the first word line WL1 of the first sub bank array 310 and the first word line WL1 of the second sub bank array 330 corresponding to the adjacent row address RA_A that is the first row address RA1 is simultaneously enabled, the stored data in the memory cells that are connected to the first word line WL1 of the first sub bank array 310 and the first word line WL1 of the second sub bank array 330 may be restored.

Figure 9:
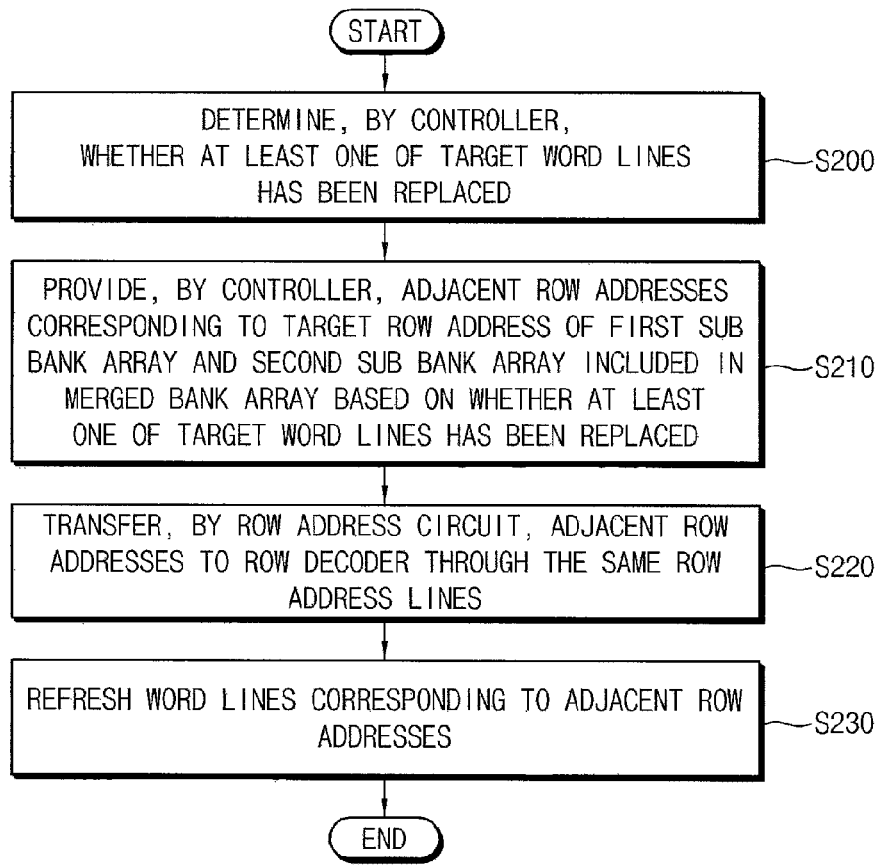
FIG. 9 is a flow chart illustrating a method of operating a memory device according to example embodiments.

FIG. 9 is a flow chart illustrating a method of operating a memory device according to example embodiments.

Referring to FIGS. 2, 3 and 9, a memory device 10 may include a control circuit 100, a merged bank array 300, a row address circuit 500 and a row decoder 400. The merged bank array 300 may include a first sub bank array 310 and a second sub bank array 330. In a method of operating a memory device 10, a control circuit 100 determines whether a target word line corresponding to a target row address TRA has been replaced (S200). For example, the target row address TRA may be a row address corresponding to a second word line WL2. The second word line WL2 included in the first sub bank array 310 may be a normal word line. The second word line WL2 included in the second sub bank array 330 may be a word line including one or more bad cells. For example, when the target row address TRA corresponding to the second word line WL2 included in the second sub bank array 330 is transferred from the control circuit 100, an N-th word line WL(N) included in the second sub bank array 330 may be enabled instead of the second word line WL2 included in the second sub bank array 330. For example, the control circuit 100 may determine that the target word line (e.g., WL2) has been replaced.

The control circuit 100 provides adjacent row addresses RA_A of adjacent word lines WLA to the target word line corresponding to the target row address TRA of a first sub bank array 310 and a second sub bank array 330 included in a merged bank array 300 based on whether at least one of the target word lines has been replaced (S210). For example, when the control circuit 100 determines that the target word line of the second sub bank array 330 has been replaced, the target word line corresponding to the target row address TRA of the first sub bank array 310 may be the second word line WL2 of the first sub bank array 310. The adjacent word line WLA to the second word line WL2 of the first sub bank array 310 may be a first word line WL1 of the first sub bank array 310 and a third word line WL3 of the first sub bank array 310. The adjacent row address RA_A of the first sub bank array 310 may be a first row address RA1 of the first sub bank array 310 and a third row address RA3 of the first sub bank array 310. In addition, when the control circuit 100 determines that the target word line of the second sub bank array 330 has been replaced, the target word line corresponding to the target row address TRA of the second sub bank array 330 may be the N-th word line WL(N) of the second sub bank array 330. The adjacent word line WLA to the N-th word line WL(N) of the second sub bank array 330 may be an (N−1)th word line WL(N−1) of the second sub bank array 330 and an (N+1)th word line WL(N+1) of the second sub bank array 330. The adjacent row address RA_A of the second sub bank array 330 may be an (N−1)th row address RA(N−1) of the second sub bank array 330 and an (N+1)th row address RA(N+1) of the second sub bank array 330.

A row address circuit 500 transfers the adjacent row addresses RA_A to a row decoder 400 through the same row address lines 510 (S220). Memory cells connected to the word lines corresponding to the adjacent row addresses RA_A are refreshed (S230). For example, when the target word line corresponding to the target row address TRA is frequently enabled (e.g., greater than 1000, 2000, etc.) in a predetermined period of time, the data stored in memory cells that are connected to the adjacent word line WLA to the target word line corresponding to the target row address TRA may be damaged. Therefore, the data stored in memory cells that are connected to the adjacent word line WLA to the target word line corresponding to the target row address TRA may need to be restored. The operation of restoring the stored data in memory cells may include the refresh operations described herein.

When the target word line has been replaced, the adjacent row address RA_A of the first sub bank array 310 may be different from the adjacent row address RA_A of the second sub bank array 330. For example, the adjacent row address RA_A of the first sub bank array 310 may be the first row address RA1 of the first sub bank array 310 and the third row address RA3 of the first sub bank array 310. The adjacent row address RA_A of the second sub bank array 330 may be the (N−1)th row address RA(N−1) of the second sub bank array 330 and the (N+1)th row address RA(N+1) of the second sub bank array 330. For example, the row address circuit 500 may provide the first row address RA1 through the row address lines 510 to restore the data of the memory cells that are connected to first word line WL1 corresponding to the first row address RA1 of the first sub bank array 310. For example, the data of the memory cells that are connected to the (N−1)th word line WL(N−1) corresponding to the (N−1)th row address RA(N−1) of the second sub bank array 330 may not be restored. In addition, the row address circuit 500 may provide the third row address RA3 through the row address lines 510 to restore the data of the memory cells that are connected to third word line WL3 corresponding to the third row address RA3 of the first sub bank array 310. For example, the data of the memory cells that are connected to the (N+1)th word line WL(N+1) corresponding to the (N+1)th row address RA(N+1) of the second sub bank array 330 may not be restored. For example, the row address circuit 500 may separately provide the (N−1)th row address RA(N−1) through the same row address lines 510 to restore the data of the memory cells that are connected to the (N−1)th word line WL(N−1) corresponding to the (N−1)th row address RA(N−1) of the second sub bank array 330. In addition, the row address circuit 500 may separately provide the (N+1)th row address RA(N+1) through the same row address lines 510 to restore the data of the memory cells that are connected to the (N+1)th word line WL(N+1) corresponding to the (N+1)th row address RA(N+1) of the second sub bank array 330. If the method of operating the memory device 10 is used, the additional circuit may not be required to restore the data of the memory cells that are connected to the (N−1)th word line WL(N−1) corresponding to the (N−1)th row address RA(N−1) of the second sub bank array 330 and the (N+1)th word line WL(N+1) corresponding to the (N+1)th row address RA(N+1) of the second sub bank array 330.

The method of operating the memory device 10 may decrease the chip size of the memory device 10 by providing the adjacent row addresses RA_A through the same row address lines 510 by the row address circuit 500.

Figure 10A:
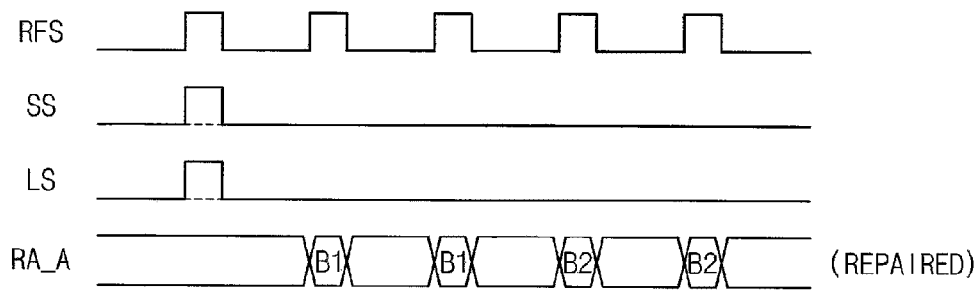
FIGS. 10A and 10B are diagrams for describing a number of refresh operations based on whether a target word line has been replaced or not according to certain embodiments.
Figure 10B:
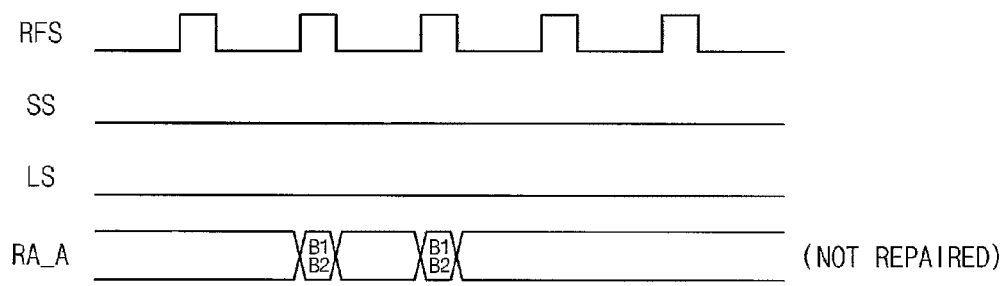

FIGS. 10A and 10B are diagrams for describing a number of refresh operations based on whether a target word line has been replaced or not according to certain embodiments.

Referring to FIGS. 3, 10A and 10B, a number of refresh operations may be determined based on whether the target row address TRA has been replaced or not.

In example embodiments, the number of refresh operations when the target word line has been replaced may be greater than the number of refresh operations when the target word line has not been replaced. For example, when the target word line has been replaced, the adjacent row address RA_A corresponding to the adjacent word lines to the target word line of the first sub bank array 310 may be the first row address RA1 of the first sub bank array 310 (e.g., B1) and the third row address RA3 of the first sub bank array 310. The adjacent row address RA_A of the second sub bank array 330 (e.g., B2) may be the (N−1)th row address RA(N−1) of the second sub bank array 330 and the (N+1)th row address RA(N+1) of the second sub bank array 330. Four refresh operations may be used to restore the data of the memory cells that are connected to word lines corresponding to the first row address RA1 of the first sub bank array 310, the third row address RA3 of the first sub bank array 310, the (N−1)th row address RA(N−1) of the second sub bank array 330 and the (N+1)th row address RA(N+1) of the second sub bank array 330.

In addition, when the target word line has not been replaced, the adjacent row address RA_A corresponding to adjacent word lines to the target word line of the first sub bank array 310 may be the first row address RA1 of the first sub bank array 310 and the third row address RA3 of the first sub bank array 310. The adjacent row address RA_A corresponding to adjacent word lines to the target word line of the second sub bank array 330 may be the first row address RA1 of the second sub bank array 330 and the third row address RA3 of the second sub bank array 330. A first one of two refresh operations may be used to restore the data of the memory cells that are connected to word lines corresponding to the first row address RA1 of the first and second sub bank arrays 310 and 330. A second one of the two refresh operations may be used to restore the data of the memory cells that are connected to word lines corresponding to the third row address RA3 of the first and second sub bank arrays 310 and 330. Therefore, the number of refresh operations when the target word line has been replaced may be greater than the number of refresh operations when the target word line has not been replaced.

Figure 11:
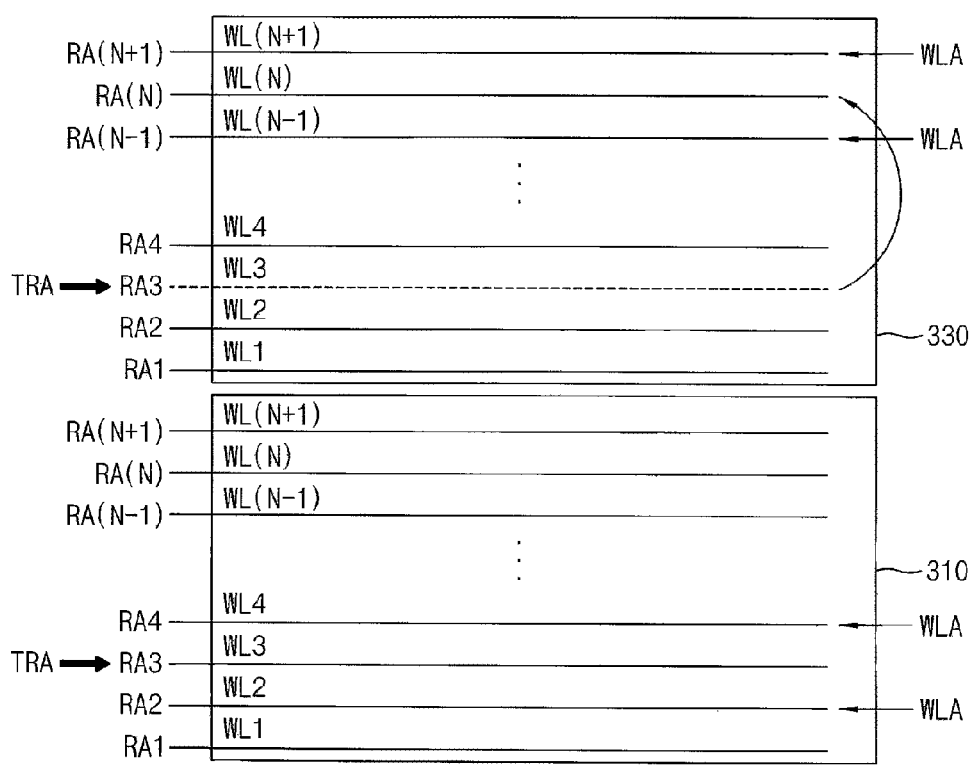
FIG. 11 is a diagram for describing an example of the method of operating the memory device of FIG. 9 according to certain embodiments.

FIG. 11 is a diagram for describing an example of the method of operating the memory device of FIG. 9 according to certain embodiments.

Referring to FIGS. 4 and 11, when the target word line (e.g., WL2) of the second sub bank array 330 has been replaced, the adjacent row address RA_A of the first sub bank array 310 may be different from the adjacent row address RA_A of the second sub bank array 330. Each of the adjacent row address RA_A of the first sub bank array 310 and the adjacent row address RA_A of the second sub bank array 330 may be transferred through the same row address lines 510 based on a refresh signal RFS.

In example embodiments, each of the adjacent row address RA_A of the first sub bank array 310 and the adjacent row address RA_A of the second sub bank array 330 may be transferred through the same row address lines 510 based on the refresh signal RFS. The adjacent row address RA_A of the first sub bank array 310 may correspond to the word line position that is greater or less than the word line position of the word line corresponding to the target row address TRA of the first sub bank array 310 by one. The adjacent row address RA_A of the second sub bank array 330 may correspond to the word line position that is greater or less than the word line position of the word line corresponding to the target row address TRA of the second sub bank array 330 by one.

In example embodiments, when the adjacent row address RA_A of the first sub bank array 310 is transferred through the same row address lines 510 based on the refresh signal RFS memory cells connected to a word line corresponding to the adjacent row address RA_A of the first sub bank array 310 may be refreshed. Also, when the adjacent row address RA_A of the second sub bank array 330 is transferred through the same row address lines 510 based on the refresh signal RFS memory cells connected to a word line corresponding to the adjacent row address RA_A of the second sub bank array 330 may be refreshed.

The word line corresponding to the target row address TRA of the first sub bank array 310 may be a third word line WL3 of the first sub bank array 310. The adjacent word line WLA to the third word line WL3 of the first sub bank array 310 may be a second word line WL2 of the first sub bank array 310 and a fourth word line WL4 of the first sub bank array 310. The adjacent row address RA_A of the first sub bank array 310 may be a second row address RA2 of the first sub bank array 310 and a fourth row address RA4 of the first sub bank array 310. In addition, the word line corresponding to the target row address TRA of the second sub bank array 330 may be an N-th word line WL(N) of the second sub bank array 330. The adjacent word line WLA to the N-th word line WL(N) of the second sub bank array 330 may be an (N−1)th word line WL(N−1) of the second sub bank array 330 and an (N+1)th word line WL(N+1) of the second sub bank array 330. The adjacent row address RA_A of the second sub bank array 330 may be the (N−1)th row address RA(N−1) of the second sub bank array 330 and the (N+1)th row address RA(N+1) of the second sub bank array 330. For example, when the control circuit 100 determines that the target word line has been replaced, a repair determination signal may be a first logic level. The first logic level may be a logic high level and a second logic level may be a logic low level. The repair determination signal may include the short signal SS and the long signal LS. After the repair determination signal transitions from the first logic level to the second logic level, if the refresh signal RFS is the logic high level, the row address circuit 500 may provide the adjacent row address RA_A that is the second row address RA2 of the first sub bank array 310 through the same row address lines 510. When the row address circuit 500 provides the adjacent row address RA_A that is the second row address RA2 of the first sub bank array 310, the second word line WL2 of the first sub bank array 310 corresponding to the adjacent row address RA_A that is the second row address RA2 of the first sub bank array 310 may be enabled. When the second word line WL2 of the first sub bank array 310 corresponding to the adjacent row address RA_A that is the second row address RA2 of the first sub bank array 310 is enabled, the stored data in the memory cells that are connected to the second word line WL2 of the first sub bank array 310 may be restored. In example embodiments, when the second word line WL2 of the first sub bank array 310 is enabled the second word line WL2 of the second sub bank array 330 may be simultaneously enabled.

When the refresh signal RFS is the logic high level again, the row address circuit 500 may provide the adjacent row address RA_A that is the fourth row address RA4 of the first sub bank array 310 through the same row address lines 510. When the row address circuit 500 provides the adjacent row address RA_A that is the fourth row address RA4 of the first sub bank array 310, the fourth word line WL4 of the first sub bank array 310 corresponding to the adjacent row address RA_A that is the fourth row address RA4 of the first sub bank array 310 may be enabled. When the fourth word line WL4 of the first sub bank array 310 corresponding to the adjacent row address RA_A that is the fourth row address RA4 of the first sub bank array 310 is enabled, the stored data in the memory cells that are connected to the fourth word line WL4 of the first sub bank array 310 may be restored. In example embodiments, when the fourth word line WL4 of the first sub bank array 310 is enabled the fourth word line WL4 of the second sub bank array 330 may be simultaneously enabled. When the refresh signal RFS is the logic high level again, the row address circuit 500 may provide the adjacent row address RA_A that is the (N−1)th row address RA(N−1) of the second sub bank array 330 through the same row address lines 510. When the row address circuit 500 provides the adjacent row address RA_A that is the (N−1)th row address RA(N−1) of the second sub bank array 330, the (N−1)th word line WL(N−1) of the second sub bank array 330 corresponding to the adjacent row address RA_A that is the (N−1)th row address RA(N−1) of the second sub bank array 330 may be enabled. When the (N−1)th word line WL(N−1) of the second sub bank array 330 corresponding to the adjacent row address RA_A that is the (N−1)th row address RA(N−1) of the second sub bank array 330 is enabled, the stored data in the memory cells that are connected to the (N−1)th word line WL(N−1) of the second sub bank array 330 may be restored. The operation of restoring the stored data in memory cells may be the refresh operation. In example embodiments, when the (N−1)th word line WL(N−1) of the second sub bank array 330 is enabled the (N−1)th word line WL(N−1) of the first sub bank array 310 may be simultaneously enabled.

When the refresh signal RFS is the logic high level again, the row address circuit 500 may provide the adjacent row address RA_A that is the (N+1)th row address RA(N+1) of the second sub bank array 330 through the same row address lines 510. When the row address circuit 500 provides the adjacent row address RA_A that is the (N+1)th row address RA(N+1) of the second sub bank array 330, the (N+1)th word line WL(N+1) of the second sub bank array 330 corresponding to the adjacent row address RA_A that is the (N+1)th row address RA(N+1) of the second sub bank array 330 may be enabled. When the (N+1)th word line WL(N+1) of the second sub bank array 330 corresponding to the adjacent row address RA_A that is the (N+1)th row address RA(N+1) of the second sub bank array 330 is enabled, the stored data in the memory cells that are connected to the (N+1)th word line WL(N+1) of the second sub bank array 330 may be restored. The method of operating the memory device 10 may decrease the chip size of the memory device 10 by providing the adjacent row addresses RA_A through the same row address lines 510 by the row address circuit 500. In example embodiments, when the (N+1)th word line WL(N+1) of the second sub bank array 330 is enabled the (N+1)th word line WL(N+1) of the first sub bank array 310 may be simultaneously enabled.

Figure 12:
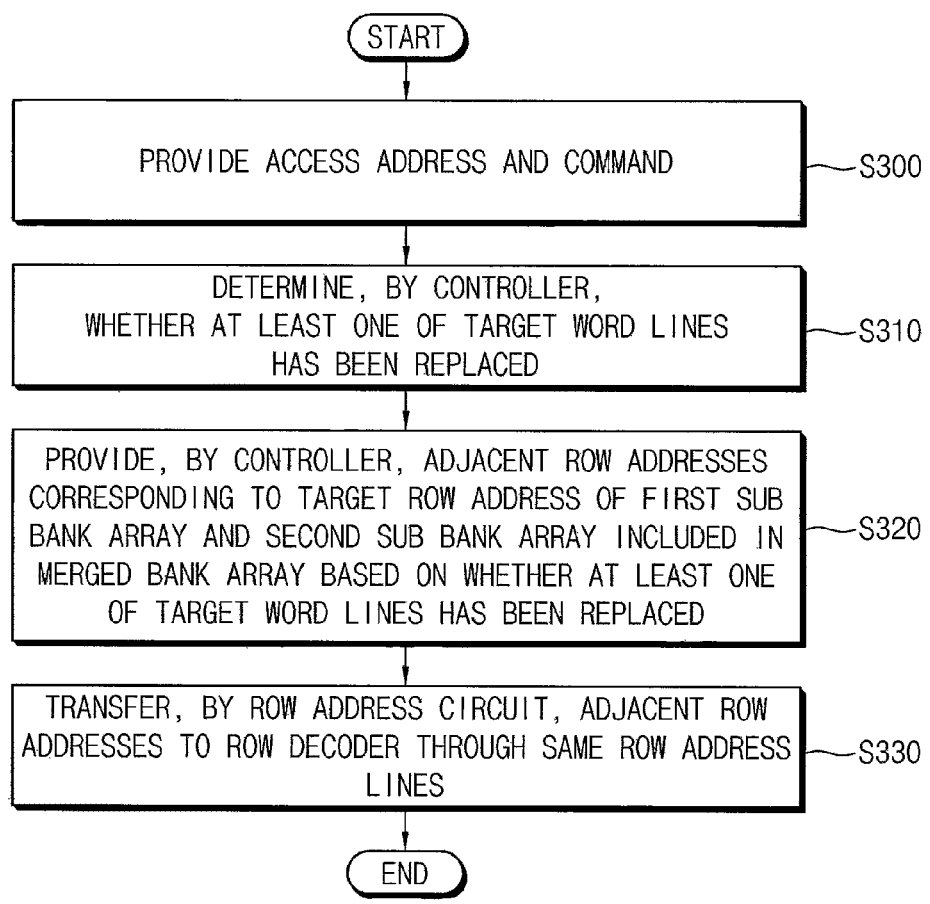
FIG. 12 is a flow chart illustrating a method of operating a memory system according to example embodiments.

FIG. 12 is a flow chart illustrating a method of operating a memory system according to example embodiments. The memory system may include a memory controller and a memory device.

Referring to FIG. 12, in a method of operating a memory system, the memory controller provides an access address and command (S300). The controller determines whether at least one of target word lines corresponding to a target row address TRA corresponding to the access address has been replaced (S310). The controller provides adjacent row addresses RA_A of adjacent word lines WLA to the target word line corresponding to the target row address TRA of a first sub bank array 310 and a second sub bank array 330 included in a merged bank array 300 based on whether at least one of the target word lines has been replaced (S320). A row address circuit 500 transfers the adjacent row addresses RA_A to a row decoder 400 through the same row address lines 510 (S330). The method of operating the memory system may decrease the chip size of the memory device by providing the adjacent row addresses RA_A through the same row address lines 510 by the row address circuit 500.

Figure 13:
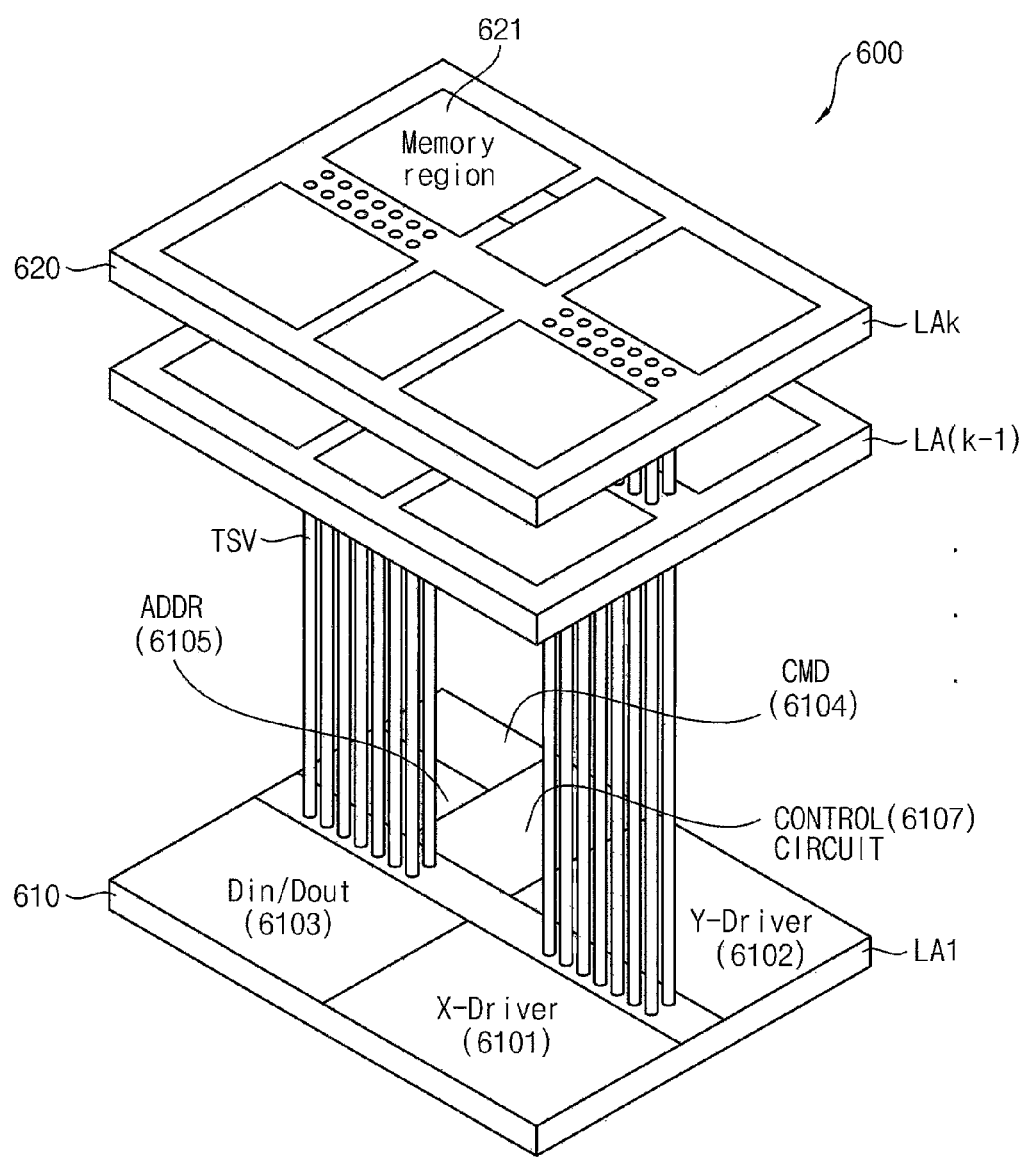
FIG. 13 is a structural diagram illustrating a semiconductor memory device according to example embodiments.

FIG. 13 is a structural diagram illustrating a semiconductor memory device according to example embodiments.

Referring to FIG. 13, a semiconductor memory device 600 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. For example, each of the plurality of slave chips LA2 to LAk may be a memory including a plurality of memory cells. The first through kth semiconductor integrated circuit layers LA1 through LAk may transmit and receive signals therebetween through through-substrate vi as (e.g., through-silicon-vias, (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAk or 620 as the slave chip.

The first semiconductor integrated circuit layer 610 may include various peripheral circuits for driving memory regions 621 included in the gth (g is a natural number greater than 2) semiconductor integrated circuit layer 620. For example, the first semiconductor integrated circuit layer 610 may include a row (X)-driver 6101 for driving word-lines of the memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address.

The first semiconductor integrated circuit layer 610 may further include a control circuit 6107. The control circuit 6107 may control an access to the memory region 621 based on a command and an address signal from a memory controller and may generate control signals for accessing the memory region 621.

In some example embodiments, each of the plurality of slave chips LA2 to LAk may be implemented with the memory device 10 or 201 of FIGS. 2 and 5.

Figure 14:
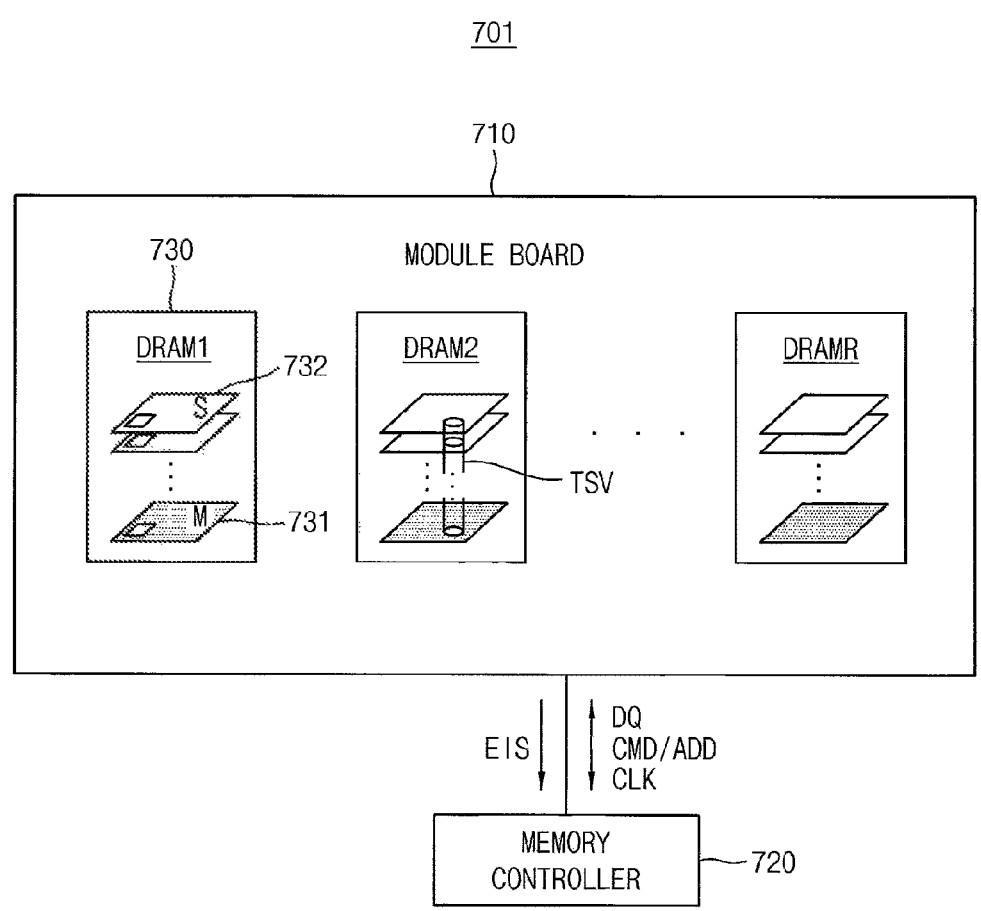
FIG. 14 illustrates a memory system including the semiconductor memory device according to example embodiments.

FIG. 14 illustrates a memory system including the semiconductor memory device according to example embodiments.

Referring to FIG. 14, a memory system 701 may include a memory module 710 and a memory controller 720. The memory module 710 may include at least one semiconductor memory device 730 mounted on a module board. For example, the semiconductor memory device 730 may be constructed as a DRAM chip. In addition, the semiconductor memory device 730 may include a stack of semiconductor chips. For example, the semiconductor chips may include at least one master chip 731 and at least one slave chip 732. Signal transfer between the semiconductor chips may occur via through-substrate vias (e.g., through-silicon vias (TSVs).

The semiconductor memory device 730 may be implemented with the memory device 10 or 201 of FIGS. 2 and 5. A detailed description of the semiconductor memory device 730 will be omitted for convenience of illustration.

The memory module 710 may communicate with the memory controller 720 via a system bus. Data DQ, a command/address CMD/ADD, and a clock signal CLK may be transmitted and received between the memory module 710 and the memory controller 720 via the system bus.

Figure 15:
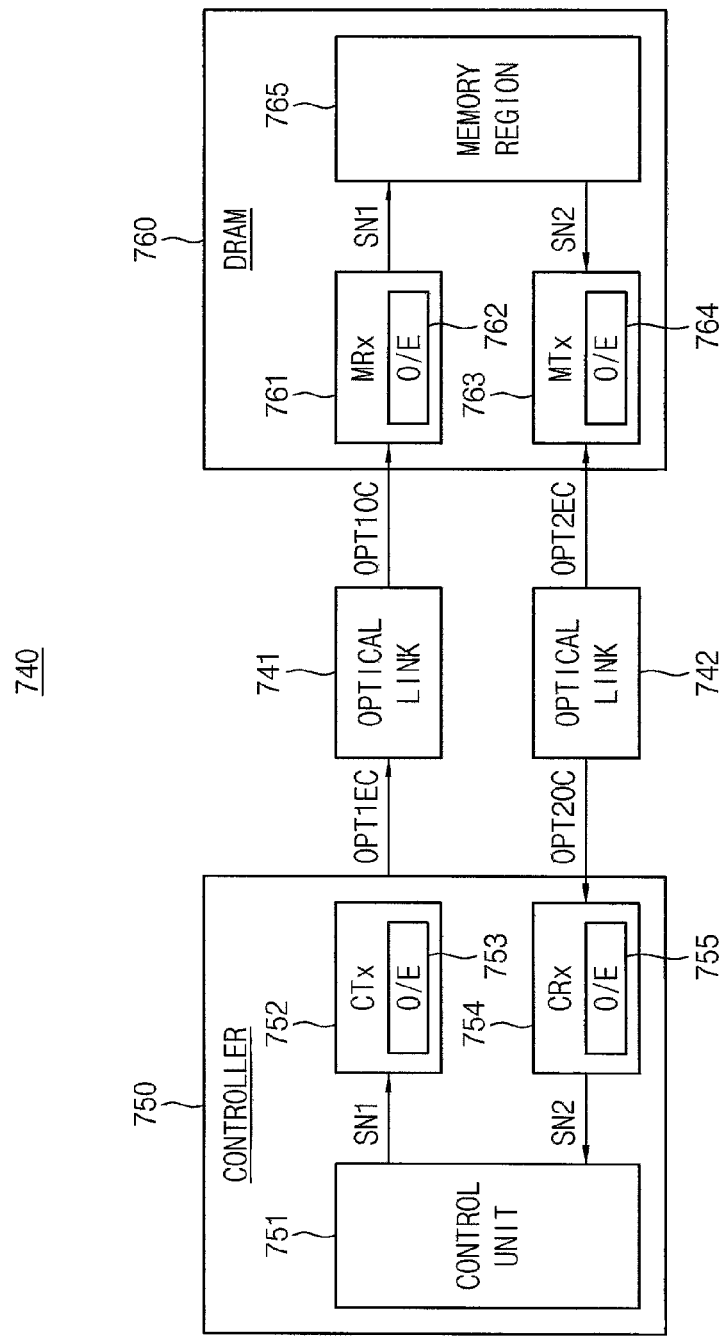
FIG. 15 is a block diagram illustrating a memory system including the semiconductor memory device according to example embodiments.

FIG. 15 is a block diagram illustrating a memory system including the semiconductor memory device according to example embodiments.

Referring to FIG. 15, a memory system 740 may include optical links 741 and 742, a controller 750, and a semiconductor memory device 760. The optical links 741 and 742 interconnect the controller 750 and the semiconductor memory device 760. The controller 750 may include a control unit 751, a first transmitter 752, and a first receiver 754. The control unit 751 may transmit a first electrical signal SN1 to the first transmitter 752. The first electrical signal SN1 may include command signals, clock signals, address signals, or write data transmitted to the semiconductor memory device 760.

The first transmitter 752 may include a first optical modulator 753, and the first optical modulator 753 may convert the first electrical signal SN1 into a first optical transmission signal OTP1EC and may transmit the first optical transmission signal OTP1EC to the optical link 741. The first optical transmission signal OTP1EC may be transmitted by serial communication through the optical link 741. The first receiver 754 may include a first optical demodulator 755, and the first optical demodulator 755 may convert a second optical reception signal OPT2OC received from the optical link 742 into a second electrical signal SN2 and may transmit the second electrical signal SN2 to the control unit 750.

The semiconductor memory device 760 may include a second receiver 761, a memory region 765 including a plurality of dynamic memory cells, and a second transmitter 764. Also, the semiconductor memory device 760 may include an interface unit that provides various interface functions. The second receiver 761 may include a second optical demodulator 762, and the second optical demodulator 762 may convert the first optical reception signal OPT1OC received from the optical link 741 into the first electrical signal SN1 and may transmit the first optical reception signal OPT1OC to the memory region 765.

In the memory region 765, write data is written to the dynamic memory cells in response to the first electrical signal SN1, or data read from the memory region 765 is transmitted as a second electrical signal SN2 to the second transmitter 764. The second electrical signal SN2 may include clock signals and read data transmitted to the memory controller 750. The second transmitter 763 may include a second optical modulator 764, and the second optical modulator 764 may convert the second electrical signal SN2 into the second optical data signal OPT2EC and transmits the second optical data signal OPT2EC to the optical link 742. The second optical transmission signal OTP2EC may be transmitted by serial communication through the optical link 742.

The semiconductor memory device 760 may be implemented with the memory device 10 or 201 of FIGS. 2 and 5. A detailed description of the semiconductor memory device 760 will be omitted for convenience of illustration.

Figure 16:
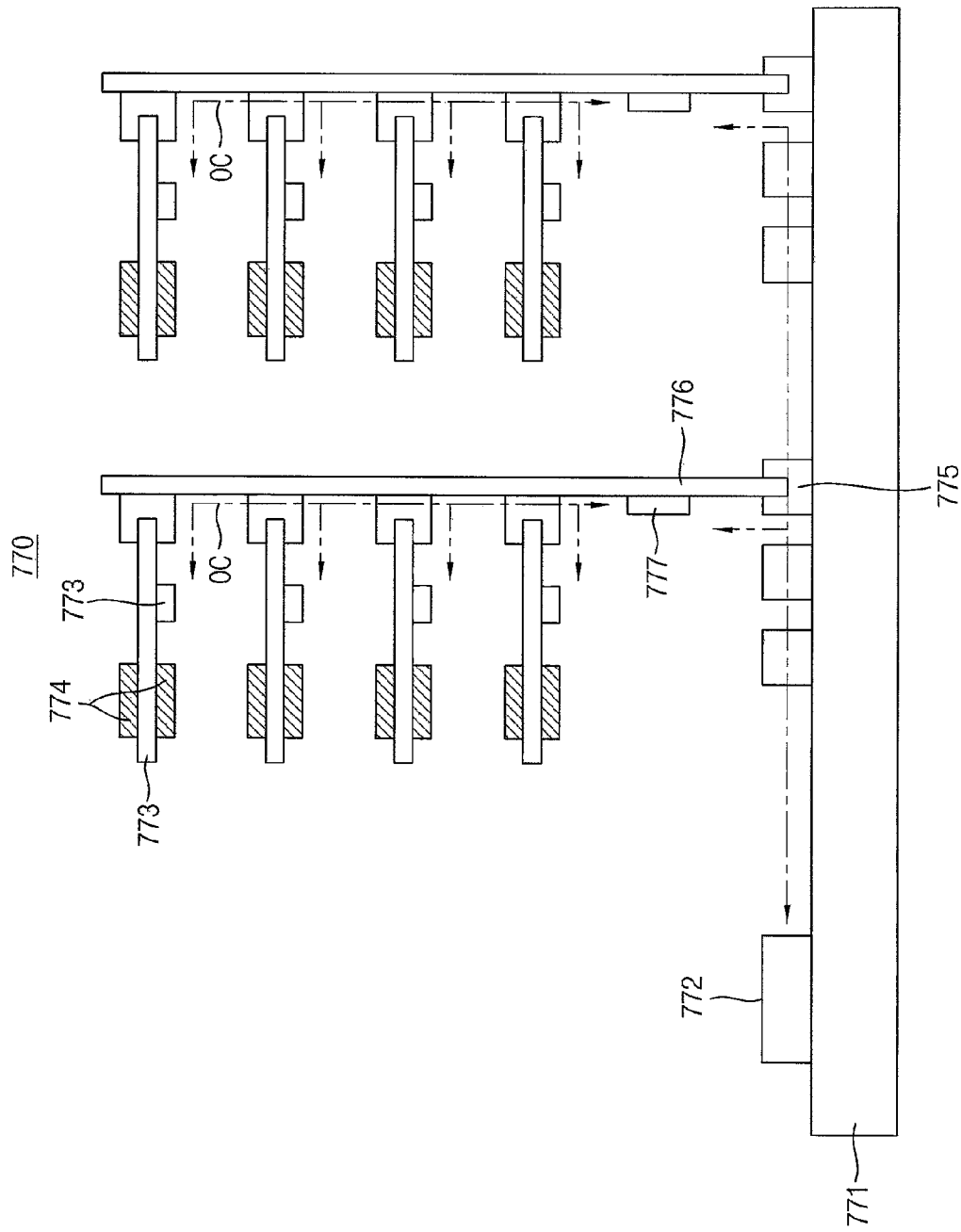
FIG. 16 is a block diagram illustrating a server system including the semiconductor memory device according to example embodiments.

FIG. 16 is a block diagram illustrating a server system including the semiconductor memory device according to example embodiments.

Referring to FIG. 16, a server system 770 includes a memory controller 772 and a plurality of memory modules 773. Each of the memory modules 773 may include a plurality of semiconductor memory devices 774.

The semiconductor memory device 774 may be implemented with the memory device 10 or 201 of FIGS. 2 and 5. A detailed description of the semiconductor memory device 774 will be omitted for convenience of illustration.

In the server system 770, a second circuit board 776 is coupled to each of sockets 775 of a first circuit board 771. The server system 770 may be designed to have a channel structure in which the second circuit board 776 is connected to the first circuit board 771 according to signal channels.

Meanwhile, a signal of the memory modules 773 may be transmitted via an optical IO connection. For the optical IO connection, the server system 770 may further include an electric-to-optical conversion unit 777, and each of memory modules 773 may further include an optical-to-electrical conversion unit.

The memory controller 772 is connected to the electric-to-optical conversion unit 777 through an electrical channel EC. The electric-to-optical conversion unit 777 converts an electrical signal received from the memory controller 772 through the electrical channel EC into an optical signal and transmits the optical signal to an optical channel OC. Also, the electric-to-optical conversion unit 777 converts an optical signal received through the optical channel OC into an electrical signal and transmits the electrical signal to the electrical channel EC.

The memory module 773 is connected to the electric-to-optical conversion unit 777 through the optical channel OC. An optical signal applied to the memory module 773 may be converted into an electrical signal through the optical-to-electric conversion unit and may be transmitted to the semiconductor memory chips 774. The server system 770 including the optical connection memory modules may support high storage capacity and a high processing speed.

Figure 17:
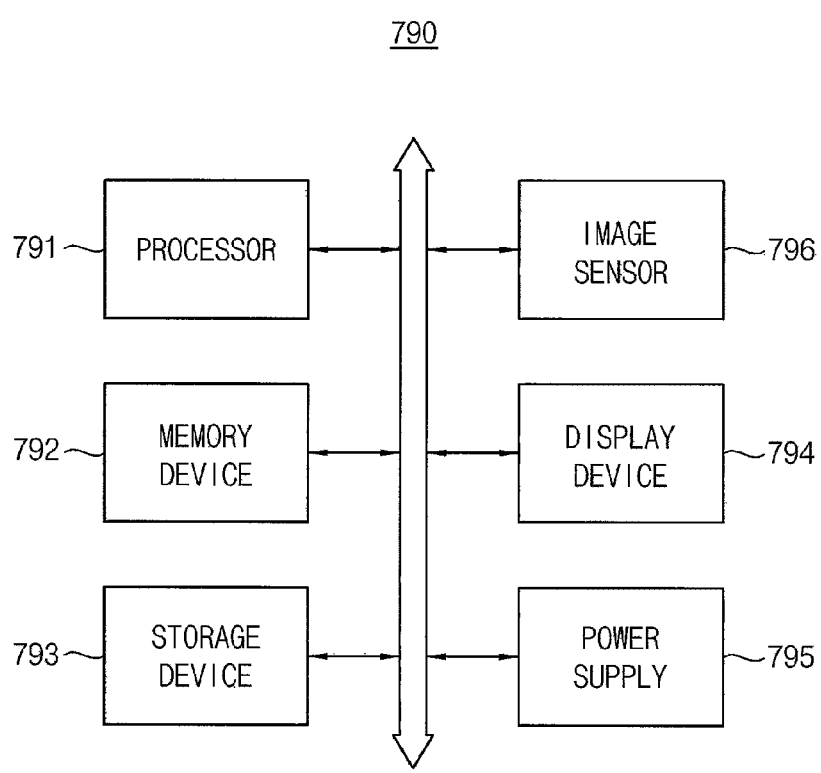
FIG. 17 is a block diagram illustrating a mobile device including the memory module according to example embodiments.

FIG. 17 is a block diagram illustrating a mobile device including the memory module according to example embodiments.

Referring to FIG. 17, a computing system 790 may include a processor 791, a memory device 792, a storage device 793, a display device 794, a power supply 795 and an image sensor 796. The computing system 790 may further include ports that communicate with a video card, a sound card, a memory card, a USB device, other electronic devices, etc.

The processor 791 may perform various calculations or tasks. According to embodiments, the processor 791 may be a microprocessor or a CPU. The processor 791 may communicate with the memory device 792, the storage device 793, and the display device 794 via an address bus, a control bus, and/or a data bus. In some embodiments, the processor 791 may be coupled to an extended bus, such as a peripheral component interconnection (PCI) bus. The memory device 792 may store data for operating the computing system 790. For example, the memory device 792 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 792 includes the data loading circuit according to example embodiments. The storage device 793 may include a solid state drive (SSD), a hard disk drive (HDD), a CD-ROM, etc. The computing system 790 may further include an input device such as a touchscreen, a keyboard, a keypad, a mouse, etc., and an output device such as a printer, a display device, etc. The power supply 795 supplies operation voltages for the computing system 790.

The image sensor 796 may communicate with the processor 791 via the buses or other communication links. The image sensor 796 may be integrated with the processor 791 in one chip, or the image sensor 796 and the processor 791 may be implemented as separate chips.

At least a portion of the computing system 790 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 790 may be a digital camera, a mobile phone, a smart phone, a portable multimedia player (PMP), a personal digital assistant (PDA), a computer, etc.

In addition, in an embodiment of the present disclosure, a three dimensional (3D) memory array is provided in the memory device 792. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The memory device 792 may be implemented with the memory device 10 or 201 of FIGS. 2 and 5. A detailed description of the memory device 792 will be omitted for convenience of illustration.

Figure 18:
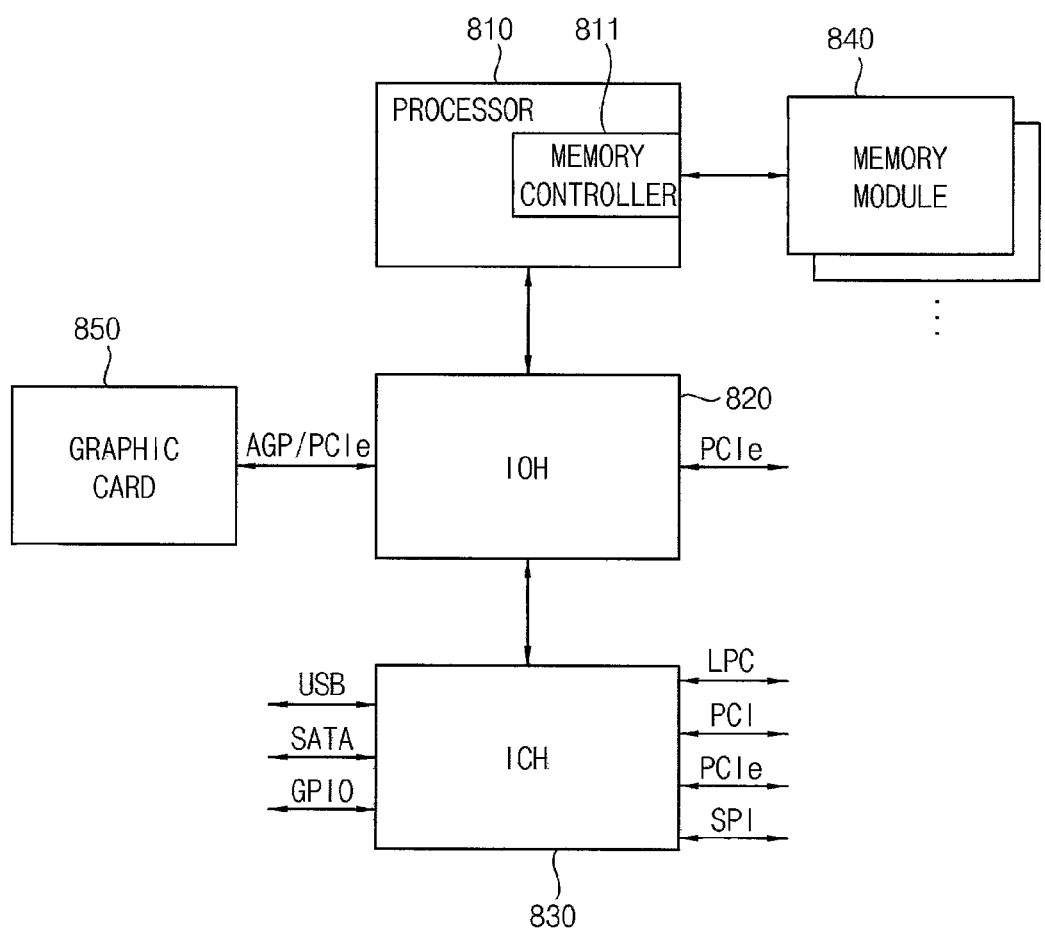
FIG. 18 is a block diagram illustrating a computing system including the memory module according to example embodiments.

FIG. 18 is a block diagram illustrating a computing system including the memory module according to example embodiments.

Referring to FIG. 18, a computing system 800 includes a processor 810, an input/output hub (IOH) 820, an input/output controller hub (ICH) 830, at least one memory module 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 21 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The memory module 840 may include a plurality of memory devices that store data provided from the memory controller 811 and a buffer chip that manages overall operation of the memory devices. Each of the memory devices may store data processed by the CPU 791, or may operate as a working memory. Each of the memory devices may be a dynamic random access memory, such as DDR SDRAM, LPDDR SDRAM, GDDR SDRAM, RDRAM, etc. The buffer chip manages operation of the memory devices.

Each of the memory devices of the memory module 840 may be implemented with the memory device 10 or 201 of FIGS. 2 and 5. A detailed description of the memory device will be omitted for convenience of illustration.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), etc. Although FIG. 21 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

The method of operating the memory device 10 may decrease the chip size of the memory device 10 by providing the adjacent row addresses RA_A through the same row address lines 510 by the row address circuit 500.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept.

What is claimed is:

1. A method of operating a memory device including first and second sub bank arrays having corresponding rows of word lines, the method comprising:
   receiving a first row address corresponding to a first word line in the first sub bank array and corresponding to a first word line in the second sub bank array;
   determining whether at least one of the first word lines has been replaced with a spare word line;
   (a) when neither of the first word lines has been replaced, receiving a first number of row addresses for refresh operations in order to refresh adjacent word lines to the first word lines; and
   (b) when at least one of the first word lines has been replaced with a spare word line, receiving a second number of row addresses for refresh operations in order to refresh adjacent word lines to any non-replaced first word lines of the first word lines and any spare word lines of the first word lines, wherein the second number is greater than the first number,
   wherein for either (a) or (b) the number of adjacent word lines being refreshed is the same.

2. The method of claim 1, wherein the first word lines and/or the spare word lines are frequently accessed word lines.

3. The method of claim 1, wherein the second number of row addresses is two times the first number of row addresses.

4. The method of claim 1, wherein receiving the first number of row addresses for refresh operations in order to refresh adjacent word lines to the first word lines comprises:
   receiving a second row address corresponding to a second word line adjacent to the first word line in the first sub bank array and corresponding to a second word line adjacent to the first word line in the second sub bank array.

5. The method of claim 4, wherein receiving the first number of row addresses for refresh operations in order to refresh adjacent word lines to the first word lines further comprises:
   receiving a third row address corresponding to a third word line adjacent to the first word line in the first sub bank array and corresponding to a third word line adjacent to the first word line in the second sub bank array.

6. The method of claim 1, wherein receiving the second number of row addresses for refresh operations in order to refresh adjacent word lines to any non-replaced first word lines of the first word lines and any spare word lines of the first word lines comprises:
   receiving a second row address corresponding to a second word line in the first sub bank array adjacent to a spare word line of the first sub bank array; and
   receiving a third row address corresponding to a third word line in the second sub bank array adjacent to a non-replaced first word line of the second sub bank array or a spare word line of the first word line of the second sub bank array.

7. The method of claim 6, wherein receiving the second number of row addresses for refresh operations in order to refresh adjacent word lines to any non-replaced first word lines of the first word lines and any spare word lines of the first word lines further comprises:
receiving a fourth row address corresponding to a fourth word line in the first sub bank array adjacent to the spare word line of the first sub bank array; and
receiving a fifth row address corresponding to a fifth word line in the second sub bank array adjacent to the non-replaced first word line of the second sub bank array or the spare word line of the first word line of the second sub bank array.

8. A method of operating a memory device including first and second sub bank arrays, the method comprising:
accessing a first word line corresponding to a first row address in each of the first and second sub bank arrays;
(a) when neither of the first word lines has been replaced, simultaneously performing a first refresh operation for a second word line adjacent to the first word line in each of the first and second sub bank arrays in response to a second row address; and
(b) when at least one of the first word lines of the first and second sub bank arrays has been replaced with a spare word line, performing a second refresh operation for a third word line in the first sub bank array adjacent to a spare word line of the first word line of the first sub bank array in response to a third row address, and performing a third refresh operation for a fourth word line in the second sub bank array adjacent to a non-replaced first word line of the second sub bank array or a spare word line of the first word line of the second sub bank array in response to a fourth row address.

9. The method of claim 8, wherein the first word lines and/or spare word lines are frequently accessed word lines.

10. The method of claim 8, further comprising:
when neither of the first word lines has been replaced, simultaneously performing a fourth refresh operation for a fifth word line adjacent to the first word line in each of the first and second sub bank arrays in response to a fifth row address.

11. The method of claim 8, further comprising:
when at least one of the first word lines of the first and second sub bank arrays has been replaced with a spare word line, performing a fourth refresh operation for a fifth word line in the first sub bank array adjacent to the spare word line of the first word line of the first sub bank array in response to a fourth row address, and performing a fifth refresh operation for a sixth word line in the second sub bank array adjacent to the non-replaced first word line of the second sub bank array or the spare word line of the first word line of the second sub bank array in response to a fifth row address.

12. The method of claim 8, wherein a number of row addresses for refresh operations in order to refresh the adjacent word lines when at least one of the first word lines of the first and second sub bank arrays has been replaced with a spare word line is greater than a number of row addresses for refresh operations in order to refresh the adjacent word lines when neither of the first word lines has been replaced.

13. The method of claim 8, wherein a memory cell array included in the memory device includes a three-dimensional memory array in which word-lines and/or bit-lines are shared between levels.

14. A method of operating a memory device including first and second memory cell arrays having first and second respective sets of corresponding word lines, the method comprising:
determining whether a first word line of the first set of word lines corresponding to a first word line of the second set of word lines has been replaced with a spare word line;
determining whether the first word line of the second set of word lines has been replaced with a spare word line;
(a) when neither of the first word lines has been replaced, performing a first number of refresh operations in order to refresh adjacent word lines to the first word lines; and
(b) when at least one of the first word lines has been replaced with a spare word line, performing a second number of refresh operations in order to refresh adjacent word lines to any non-replaced first word lines of the first word lines and any spare word lines of the first word lines, wherein the second number is greater than the first number, wherein for either (a) or (b) the number of adjacent word lines being refreshed is the same.

15. The method of claim 14, wherein the first word lines and/or spare word lines are frequently accessed word lines.

16. The method of claim 14, wherein the second number of refresh operations is two times the first number of refresh operations.

17. The method of claim 14, wherein when neither of the first word lines has been replaced, performing the first number of refresh operations in order to refresh adjacent word lines to the first word lines comprises:
simultaneously performing a first refresh operation for a second word line adjacent to the first word line in each of the first and second memory cell arrays, respectively, in response to a first refresh command and a second row address.

18. The method of claim 17, wherein when neither of the first word lines has been replaced, performing the first number of refresh operations in order to refresh adjacent word lines to the first word lines further comprises:
simultaneously performing a second refresh operation for a third word line adjacent to the first word line in each of the first and second memory cell arrays, respectively, in response to a second refresh command and a third row address.

19. The method of claim 14, wherein when at least one of the first word lines has been replaced with a spare word line, performing the second number of refresh operations in order to refresh adjacent word lines to any non-replaced first word lines of the first word lines and any spare word lines of the first word lines comprises:
performing a first refresh operation for a second word line in the first memory cell array adjacent to a spare word line of the first memory cell array in response to a first refresh command and a second row address; and
performing a second refresh operation for a third word line in the second memory cell array adjacent to a non-replaced first word line of the second memory cell array or a spare word line of the first word line of the second memory cell array in response to a second refresh command and a third row address.

20. The method of claim 19, wherein when at least one of the first word lines has been replaced with a spare word line, performing the second number of refresh operations in order to refresh adjacent word lines to any non-replaced first word lines of the first word lines and any spare word lines of the first word lines further comprises:
- performing a third refresh operation for a fourth word line in the first memory cell array adjacent to the spare word line of the first memory cell array in response to a third refresh command and a fourth row address; and
- performing a fourth refresh operation for a fifth word line in the second memory cell array adjacent to the non-replaced first word line of the second memory cell array or the spare word line of the first word line of the second memory cell array in response to a fourth refresh command and a fifth row address.

* * * * *